(12) United States Patent
Suominen

(10) Patent No.: US 7,606,549 B2
(45) Date of Patent: *Oct. 20, 2009

(54) SELECTIVE CHANNEL TUNER AND TUNING METHOD

(75) Inventor: Edwin A. Suominen, Valley, WA (US)

(73) Assignee: University of Washington, Seattle, WA (US)

( * ) Notice: Subject to any disclaimer, the term of this patent is extended or adjusted under 35 U.S.C. 154(b) by 416 days.

This patent is subject to a terminal disclaimer.

(21) Appl. No.: 11/510,480

(22) Filed: Aug. 23, 2006

(65) Prior Publication Data

US 2007/0015482 A1    Jan. 18, 2007

Related U.S. Application Data

(60) Continuation of application No. 10/649,305, filed on Aug. 25, 2003, now Pat. No. 7,116,963, which is a continuation of application No. 10/032,526, filed on Oct. 27, 2001, now Pat. No. 6,631,256, which is a continuation of application No. 09/317,781, filed on May 24, 1999, now Pat. No. 6,427,068, which is a division of application No. 08/713,761, filed on Sep. 13, 1996, now Pat. No. 5,937,341.

(51) Int. Cl.
*H04B 1/10* (2006.01)
(52) U.S. Cl. .......................... 455/302; 455/258; 455/323
(58) Field of Classification Search .................. 455/296, 455/302, 306, 313, 323, 324, 334, 256, 257, 455/258, 303, 304, 305, 307, 310; 375/322, 375/324
See application file for complete search history.

(56) References Cited

U.S. PATENT DOCUMENTS 3,835,384 A    9/1974    Liff (Continued)

FOREIGN PATENT DOCUMENTS

| EP | 0 351 156 B1 | 3/1990 |
| EP | 0 508 401 A2 | 4/1992 |
| EP | 0 595 277 A1 | 10/1993 |
| EP | 0 602 394 A2 | 11/1993 |

(Continued)

OTHER PUBLICATIONS

"LMX2240 Intermediate Frequency Receiver," National Semiconductor product brochure, dated Apr. 1995.

(Continued)

*Primary Examiner*—Blane J Jackson
(74) *Attorney, Agent, or Firm*—Steven G. Lisa, Ltd.; James David Busch; Douglas W. Rudy

(57) ABSTRACT

A disclosed method tunes a signal from a channelized spectrum having a predetermined channel spacing. A signal of interest having a predetermined maximum bandwidth is mixed with a local oscillator signal, which has a frequency that is an integer multiple of the channel spacing or one-half of a channel spacing displaced from an integer multiple of the channel spacing. The local oscillator signal is selected to frequency translate the signal of interest to within a near-baseband passband whose lower edge is spaced from DC by at least about the maximum bandwidth of the signal of interest. Problems associated with 1/f noise, DC offsets, and self-mixing products are avoided or substantially diminished. Other methods and systems are also disclosed.

20 Claims, 11 Drawing Sheets

U.S. PATENT DOCUMENTS

| | | | |
|---|---|---|---|
| 3,942,121 A | 3/1976 | Bell et al. | |
| 3,961,262 A | 6/1976 | Gassmann | 325/345 |
| 3,992,616 A | 11/1976 | Acker | 455/318 |
| 4,241,451 A | 12/1980 | Maixner et al. | 455/202 |
| 4,339,826 A | 7/1982 | Ogita et al. | 455/183 |
| 4,353,132 A | 10/1982 | Saitoh et al. | |
| 4,450,590 A | 5/1984 | Lafferty et al. | |
| 4,553,264 A | 11/1985 | Hasegawa et al. | |
| 4,580,289 A | 4/1986 | Enderby | |
| 4,584,715 A | 4/1986 | Baars et al. | 455/302 |
| 4,675,882 A | 6/1987 | Lillie et al. | 375/345 |
| 4,727,591 A | 2/1988 | Manlove | |
| 4,737,728 A | 4/1988 | Nakamura et al. | 329/110 |
| 4,803,700 A | 2/1989 | Dewey et al. | 375/77 |
| 4,859,960 A | 8/1989 | Standford et al. | 329/126 |
| 4,864,643 A | 9/1989 | French et al. | 455/302 |
| 4,884,265 A | 11/1989 | Schroeder et al. | 370/70 |
| 4,914,408 A | 4/1990 | Voorman | 333/167 |
| 4,944,025 A | 7/1990 | Gehring et al. | 455/207 |
| 4,953,182 A | 8/1990 | Chung | 375/97 |
| 4,965,853 A | 10/1990 | Barnard | 455/209 |
| 4,992,736 A | 2/1991 | Stormont et al. | 324/309 |
| 4,994,769 A | 2/1991 | Kishi | 332/170 |
| 5,003,621 A | 3/1991 | Gailus | 455/324 |
| 5,010,399 A | 4/1991 | Goodman et al. | 358/85 |
| 5,020,147 A | 5/1991 | Okanobu | 455/302 |
| 5,023,933 A | 6/1991 | Karkota, Jr. | 455/45 |
| 5,121,070 A | 6/1992 | Tomita | 329/304 |
| 5,125,008 A | 6/1992 | Trawick et al. | 375/349 |
| 5,134,509 A | 7/1992 | Olshansky et al. | |
| 5,142,553 A | 8/1992 | Rosenkranz | 375/75 |
| 5,214,796 A | 5/1993 | Gorrie et al. | 455/326 |
| 5,230,099 A | 7/1993 | Loper | 455/324 |
| 5,249,203 A | 9/1993 | Loper | 375/97 |
| 5,315,425 A | 5/1994 | Van Deventer et al. | 359/153 |
| 5,339,455 A | 8/1994 | Vogt et al. | 455/266 |
| 5,341,107 A | 8/1994 | Bijker et al. | 329/337 |
| 5,355,513 A | 10/1994 | Clarke et al. | 455/20 |
| 5,375,146 A | 12/1994 | Chalmers | 375/103 |
| 5,376,894 A | 12/1994 | Petranovich | 329/306 |
| 5,402,449 A | 3/1995 | Schultes et al. | 375/94 |
| 5,438,329 A | 8/1995 | Gastouniotis et al. | 340/870.02 |
| 5,461,643 A | 10/1995 | LaRosa et al. | 375/329 |
| 5,528,633 A | 6/1996 | Halik et al. | 375/326 |
| 5,548,244 A | 8/1996 | Clewer | 329/318 |
| 5,588,025 A | 12/1996 | Strolle et al. | 375/316 |
| 5,619,206 A | 4/1997 | Cole, Jr. et al. | 342/37 |
| 5,640,698 A | 6/1997 | Shen et al. | 455/323 |
| 5,661,485 A | 8/1997 | Manuel | |
| 5,682,099 A | 10/1997 | Thompson et al. | 324/338 |
| 5,682,431 A | 10/1997 | Ohnishi et al. | 381/7 |
| 5,696,796 A | 12/1997 | Poklemba | 375/316 |
| 5,715,529 A | 2/1998 | Kianush et al. | 455/266 |
| 5,722,040 A | 2/1998 | Bjerede et al. | |
| 5,734,976 A | 3/1998 | Bartschi et al. | 455/333 |
| 5,737,035 A | 4/1998 | Rotzoll | 348/725 |
| 5,742,274 A | 4/1998 | Henry et al. | 327/113 |
| 5,758,274 A | 5/1998 | Vu et al. | 455/246.1 |
| 5,761,615 A | 6/1998 | Jaffee | 455/314 |
| 5,784,414 A | 7/1998 | Bruekers et al. | 375/324 |
| 5,784,418 A | 7/1998 | Sykes et al. | 375/347 |
| 5,802,463 A | 9/1998 | Zuckerman | 455/208 |
| 5,809,090 A | 9/1998 | Buternowsky et al. | 375/347 |
| 5,811,972 A | 9/1998 | Thompson et al. | 324/338 |
| 5,815,529 A | 9/1998 | Wang | 375/285 |
| 5,826,180 A | 10/1998 | Golan | 455/302 |
| 5,828,955 A * | 10/1998 | Lipowski et al. | 455/324 |
| 5,832,375 A | 11/1998 | Leisten et al. | |
| 5,838,730 A | 11/1998 | Cripps | |
| 5,850,598 A * | 12/1998 | Behrent | 455/324 |
| 5,875,212 A | 2/1999 | Fleek et al. | 375/329 |
| 5,887,247 A | 3/1999 | Baltus et al. | 455/277.2 |
| 5,950,119 A | 9/1999 | McGeehan et al. | 455/302 |
| 5,974,306 A | 10/1999 | Hornak et al. | 455/323 |
| 6,073,000 A | 6/2000 | Shinohara | 455/310 |
| 7,116,963 B2 * | 10/2006 | Suominen | 455/302 |

FOREIGN PATENT DOCUMENTS

| | | |
|---|---|---|
| EP | 0 651 522 A1 | 5/1995 |
| JP | 7-283810 | 10/1995 |
| WO | WO 94/10756 | 5/1994 |
| WO | WO 94/29948 | 12/1994 |

OTHER PUBLICATIONS

Ehrhardt, D. and Benkner, T. "Digital TV Receiver with a Low IF," in *IEEE Transactions on Consumer Electronics*, vol. 39, No. 3,pp. 331-339, Aug. 1993.

Kasperkovitz, W.G. "FM Receivers for Mono and Stereo on a Single Chip," in *Phillips Technical Review*, vol. 41, No. 6, pp. 169-182, 1984.

"ESSCIRC '96," Web Page Printout (excerpts, pp. 1, 22) from http://www.imec.be/esscirc/papers-96/author.htm, indicating (see p.22) Steyaert, M. paper "RF Integrated Circuits in Standard CMOS Technologies" as being part of ESSCIRC '96 proceedings.

"ESSCIRC '96," Web Page Printout from http://www.imec.be/esscirc/papers-96/default.htm, indicating ESSCIRC '96 date of Sep. 17-19, 1996.

"Low Cost RF Modem," *IBM Technical Disclosure Bulletin*, Sep. 1986, pp. 1511-1513.

Abidi, A. "Radio-Frequency Integrated Circuits for Portable Communications," in *IEEE 1994 Custom Integrated Circuits Conference*, May 1994, pp. 151-158.

Baumberger, W. "A Single-Chip Image Rejecting Receiver for the 2.44 GHz Band Using Commerical GaAs-MESFET-Technology," in *IEEE Journal of Solid-State Circuits*, vol. 29, No. 10, Oct. 1994, pp. 1244-1249.

Casaju Quiros, F. and Paez Borrallo, J. A Low If Image Rejection Receiver For DECT, RACE Mobile Telecommunications Summit, Cascais, Portugal, Nov. 22-24, 1995, vol. 1.

Crols, J. and Steyaert, M. "An Analog Integrated Polyphase Filter for a High Performance Low-IF Receiver," in *Proc. VLSI Circuits Symposium*, Kyoto, Jun. 1995, pp. 87-88.

Crols, J. and Steyaert, M. "Low-IF Topologies for High-Performance Analog Front Ends of Fully Integrated Receivers," in *IEEE Transactions on Circuits and Systems*, vol. 45, No. 3, Mar. 1998, pp. 269-282.

Crols, J. et al. "A Single-Chip 900 MHz CMOS Receiver Front-End with a High Performance Low-IF Topology," *IEEE Journal of Solid-State Circuits*, vol. 30, No. 12, Dec. 1995, pp. 1483-1492.

Demeure, C. "A Portable HF Transceiver with Digital IF," in *Fifth International Conference on HF Radio Systems and Techniques*, Jul. 1991, pp. 290-294.

Ehrhardt, D. and Benkner, T. "Digital TV Receiver with a Low IF," in *IEEE Transactions on Consumer Electronics*, vol. 39, No. 3, Aug. 1993, pp. 331-339.

Fernandez-Duran, A. et al., Alcatel, "Zero-IF Receiver Architecture for Multistandard Compatible Radio Systems," 46th IEEE Vehicular Technology Conference, May 1996, pp. 1052-1056.

Gray, P. et al. "Future Directions in Silicon ICs for RF Personal Communications," *Proceeding of the IEEE 1995 Custom Integrated Circuits Conference*, Berkeley, CA, May 1-4, 1995, pp. 83-90.

Hawley, R. et al. "A 300 MHz Digital Double-Sideband to single-Sideband Converter in 1 uM CMOS," *IEEE Journal of Solid-State Circuits*, vol. 30, No. 1, Jan. 1995.

Henderson, B. and Cook, J. "Image-Reject and Single-Sideband Mixers," *WJ Tech-Note*, vol. 12, No. 3, May/Jun. 1985.

Jacobsen, G. "Low IF Quadrature Optical High Sensitivity ASK Receivers," in *Electronics Letters*, vol. 30, No. 13, Jun. 1994, pp. 1026-1028.

Kuhn, W. "Design of Integrated, Low Power, Radio Receivers in BiCMOS Technologies," PhD Dissertation dated "Dec. 1995."

Larson, L. (ed.), *RF and Microwave Circuit Design for Wireless Communications*, Artech House, Boston, pp. 52-55 (excerpt from Chapter by Asad A. Abidi, UCLA).

Min, J. et al. "An All-CMOS Architecture for a Low-Power Frequency-Hopped 900 MHz Spread Spectrum Transceiver," IEEE 1994 Custom Intergrated Circuits Conference, Los Angeles, CA, pp. 379-382.

Okanobu, T. "Advanced Low Voltage Single Chip Radio IC," in *IEEE Transactions on Consumer Electronics*, vol. 38, No. 3, Aug. 1992, pp. 465-475.

Okanobu, T. et al. "An Advanced Low Power Radio 1 Chip IC," in *IEEE Transactions on Consumer Electronics*, vol. 40, No. 4, Nov. 1994, pp. 842-851.

Oscarsson, F. and Lindblad, A. National Defence Research Establishment, Sweden, "Wideband HF Receiver With Digital Quadrature Splitting," 1993, pp. 1267-1271.

Paez-Borrallo, J. and Casaju Quiros, F. "Self Calibrating Low IF Digital Image Rejection Receiver For Mobile Communications" (believed presented at conference Sep. 10, 1996).

Philips Semiconductors, Specification Sheet, "Image Rejecting Front-end for GSM Applications, UAA2072M."

Steyaert, M. and Crols J. "Analog Integrated Polyphase Filters," in Workshop on Advances in Analog Circuit Design (Eindhoven, Netherlands), Mar. 29-31, 1994. Cited copy is from R.J. van de Plassche et al. (eds.), *Analog Circuit Design*, pp. 149-166, Copyright 1995, Kluwer Academic Publishers.

Steyaert, M. et al. "RF Integrated Circuits in Standard CMOS Technologies," undated.

Van Dooremolen W. et al. "Application Note AN192: A complete FM radio on a chip," Philips Semiconductors, dated "Dec. 1991".

van Gils, R. et al., "2.5 Gbit/s CPFSK System with Low Central IF," in *Electronics Letters*, vol. 30, No. 14, Jul. 1994, pp. 1153-1154.

Wuorinen, J. "A Fully Integrated 900MHz CMOS Double Quadrature Downconverter," 1995 IEEE International Solid-State Circuits Conference, *Digest of Technical Papers*, Castine, ME, First Edition, Feb. 1995, pp. 137-138.

Yamazaki, D. et al., "A Complete Single Chip AM Stereo/FM Stereo Radio IC," in *IEEE Transactions on Consumer Electronics*, vol. 40, No. 3, Aug. 1994, pp. 563-569.

Bugaj, M. "How to Greatly Increase Your Receiver's Selectivity," http://pages.cthome.net/fmdx/filter.html., 1999.

Dorren, L. et al. "An Optimum Quadraphonic FM Broadcasting System," IEEE Transactions on Broadcast and Television Receivers, vol. BTR-19, Issue 4, pp. 277-285, 1973.

Emslie, T. "How to Select a FM tuner for 88-108 MHz DX," http://www.geocities.com/toddemslie/howtoselectatunerforfmdx.htm., 2006.

"Final Acts of the Regional Administrative Conference for the Planning of VHF Sound Broadcasting (Region 1 and Part of Region 3)," ITU, p. 28, 1984.

Kuroda, T. et al. "Development of an FM Multiplex Broadcasting System having a Large Transmission Capacity," Int'l Broadcasting Convention 1990, pp. 241-245, 1990.

Miki, S. et al. "Some Considerations Regarding FM Four-Channel Stereo Broadcasting Systems," in *Journal of the Audio Engineering Society*, vol. 23, No. 4, pp. 274-281, 1975.

Onoe, M. "Crystal, Ceramic, and Mechanical Filters in Japan," in *Proc. of the IEEE*, vol. 67, Issue 1, pp. 75-102, 1979.

\* cited by examiner

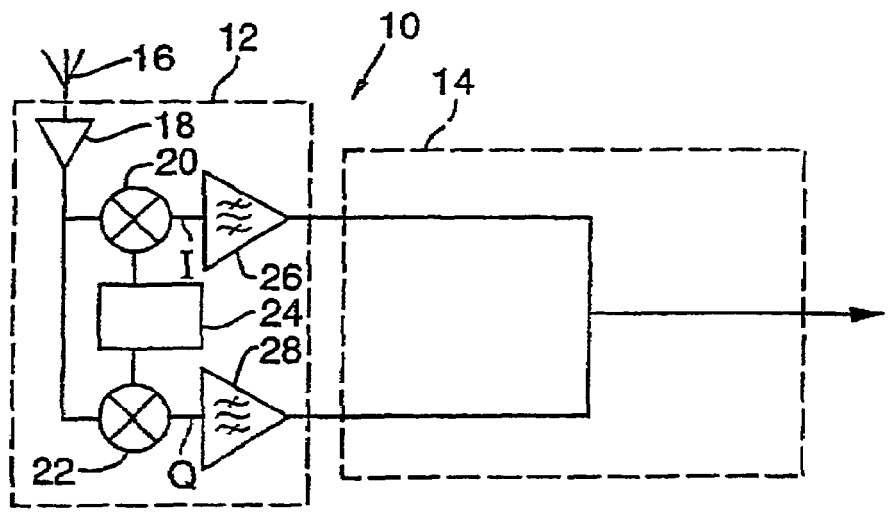
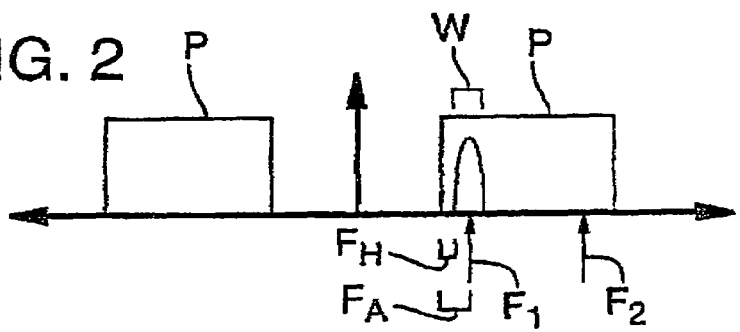
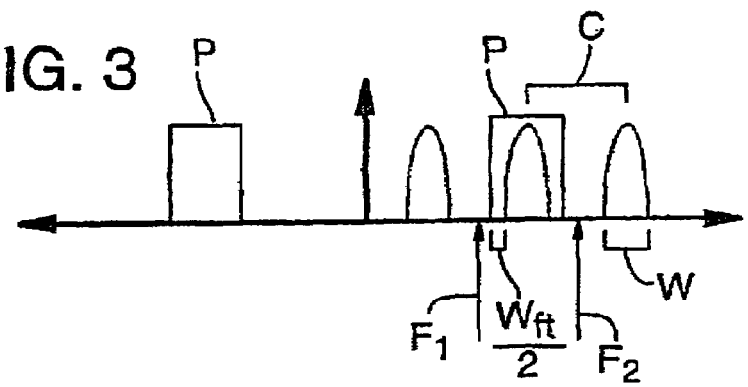
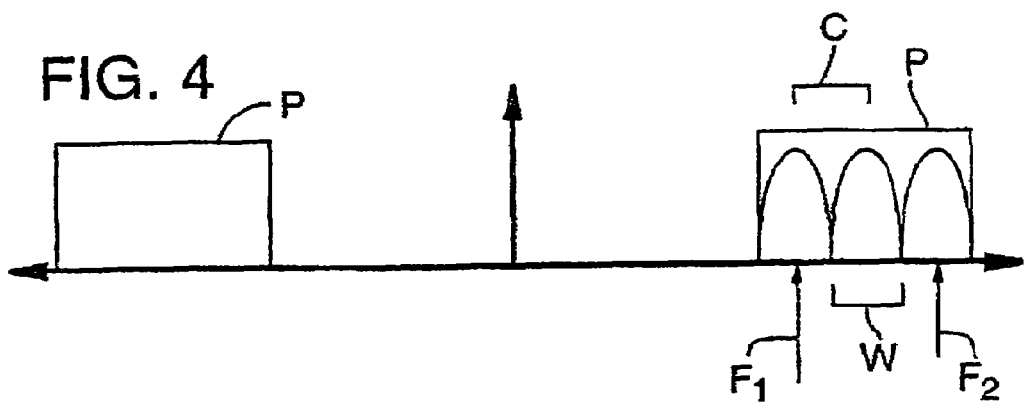

SELECTIVE CHANNEL TUNER AND TUNING METHOD

CROSS REFERENCE TO RELATED APPLICATIONS

This application is a continuation of application Ser. No. 10/649,305, filed Aug. 25, 2003, now U.S. Pat. No. 7,116,963; which is a continuation of application Ser. No. 10/032,526, filed Oct. 27, 2001, now U.S. Pat. No. 6,631,256; which is a continuation of application Ser. No. 09/317,781, filed May 24, 1999, now U.S. Pat. No. 6,427,068; which is a divisional of application Ser. No. 08/713,761, filed Sep. 13, 1996, now U.S. Pat. No. 5,937,341.

FIELD OF THE INVENTION

This invention relates generally to devices and methods for receiving and transmitting RF signals. More particularly, this invention relates to an especially useful device and method for receiving and tuning RF signals, with quadrature mixing to a near baseband passband performed in continuous-time and image rejection and translation to baseband performed in discrete-time. The device may also be adapted to transmit RF signals if desired.

BACKGROUND OF THE INVENTION

Standard RF receiver design incorporates conversion of incoming high frequency signals to one or more intermediate frequencies, the last of which is then converted to baseband. A mixer and image rejection filter are required at each stage, resulting in complexity proportional to the number of stages. Such complexity is undesirable, particularly for mobile communications applications where size, power consumption, and cost per unit must be minimized.

Various approaches have been taken to reduce the size, power consumption, and cost of receivers. One approach is to perform nearly all of the receiver functions in the discrete-time domain in a DSP (digital signal processor) device. This results in high DSP performance requirements and cost. Other approaches employ discrete-time processing for baseband and for some intermediate frequency operations, reducing the DSP performance requirements, but still requiring at least one high performance continuous-time image rejection filter.

Direct conversion receivers offer a potential alternative for avoiding some of the limitations of other approaches. Receivers of this type employ quadrature mixing directly to baseband. Discrete-time processing can be efficiently utilized at baseband frequencies to demodulate the signal of interest, employing the quadrature baseband signals to utilize the entire signal spectrum centered at baseband. The complex-valued signal comprised of the I, Q samples allows the faithful representation of the signal of interest on both sides of baseband without distortion from images from opposite sides of baseband. Thus only a single continuous-time frequency conversion stage need be employed. No preselecting bandpass filter is required to eliminate an undesired mixing image, so that a broad tuning range is possible.

Despite the above potential advantages, direct conversion receivers also present problems including: (1) 1/f noise, which dominates active devices at low frequencies, particularly below 100 Hz, (2) time-varying DC offsets which can saturate the later stages of the baseband signal chain, (3) products of self-mixing of strong signals which can be present at baseband, (4) relatively small phase and amplitude errors between channels considerably reduce image rejection, and (5) fairly sharp anti-aliasing filters are required and can distort the desired signal if not carefully designed and precisely matched.

Attempts have been made to provide the advantages of direct conversion without the disadvantages by "notching out" DC from the baseband signal. This method performs well only if the signal type contains little or no information at or near DC. If the notch at DC is sufficiently narrow to minimize loss of information, the problems listed above related to amplification at or near DC are not eliminated.

Attempts have been made to avoid losing the information at and near DC and avoid the need for image rejection by translating a desired channel frequency from a channelized frequency spectrum to a frequency offset a small fixed amount from baseband, with the offset large enough to move the DC portion of the channelized signal into a passband which excludes DC, but small enough to prevent the next adjacent channel from appearing in the passband. This technique may preserve the DC portion of the signal, but requires sharp cut-off highpass and anti-aliasing filters and, because of the proximity of the passband to DC, still suffers somewhat from the other problems listed above.

SUMMARY OF THE INVENTION

In accordance with the present invention, a high frequency spectrum of interest is translated in continuous-time to a near-baseband passband by quadrature mixing, preferably with a coarse-tuned local oscillator, producing I and Q signals in approximate quadrature relation. The I and Q signals are then filtered in continuous-time to remove DC and to prevent unwanted aliasing upon digital conversion, and are then converted to digital I and Q signals.

In digital processing, various steps are performed including (1) phase correction (optionally including group delay correction) and amplitude correction between the I and Q signals, (2) rejection of an image signal by means of complex filtering or a Hilbert transform pair and adder, (3) further bandlimiting, and, (4) translation of the desired signal from the near-baseband passband to baseband, which step may include digital fine-tuning over the near-baseband passband. If the desired signal is part of a channelized spectrum, the digital fine-tuning capability may be omitted or reduced to a coarse step-wise digital tuning capability with steps equal to the channel spacing, but a translation from near-baseband to baseband is still performed. These steps may be performed in combination and in various orders to achieve the desired effect.

The inventive tuning method provides certain advantages of direct conversion receivers, including preferably a single continuous-time down-conversion stage, lack of image rejection filters with resulting wide possible tuning range, and relatively low frequency at conversion to discrete-time, allowing lower discrete-time processing rates and simplified decimation filter architecture. The inventive method also avoids the problems of 1/f noise and DC offset and self-mixing by avoiding the need for analog amplification of signal frequencies at baseband or only slightly offset from baseband.

The inventive tuning method further provides certain unique advantages.

For example, some significant advantages result from the inventive method's optimal division of tasks between continuous-time and discrete-time components.

In the inventive method, continuous-time components perform those tasks for which they are well suited, particularly the initial downconversion of a high frequency signal, while discrete-time components perform the tasks for which they are well suited, such as signal processing only at baseband and near baseband frequencies, yielding both relaxed continuous-time component tolerances and relatively reduced discrete-time processing speed and power requirements.

Further, the size and location of the near-baseband passband utilized in the invention and of the associated digital fine-tuning range or channelized spectrum channel spacing, if any, are so organized that the step size of the coarse-tuned local oscillator may be set to about twice the digital tuning range without any loss of spectrum coverage. The doubled step size relaxes the local oscillator requirements and reduces phase noise generated by the local oscillator. This relaxation of local oscillator (typically a PLL) requirements allows the local oscillator to cover a wider frequency range, so that the invention can take better advantage of the wide tuning range afforded by the lack of an image-rejection filter.

In the preferred embodiments, the invention also includes a type III Hilbert transform, i.e., a case III FIR phase-inverting allpass filter, for image rejection processing. The near-baseband passband utilized in the invention is then optimally sized and located for use with a type III Hilbert transform such that substantial computational and memory resource savings are realized while maintaining excellent performance.

A fuller appreciation of the above advantages and features and of additional advantages and features of the invention will be gained by those of skill in the art from the detailed description of the preferred embodiments which follows, and from practice of the invention itself.

BRIEF DESCRIPTION OF THE DRAWINGS

FIG. 1 is a diagram of a device according to the present invention.

FIG. 2 is a diagram of the near-baseband passband utilized by present invention.

FIGS. 3 and 4 are diagrams illustrating the use of the near-baseband passband of the present invention with channelized frequency spectra.

DETAILED DESCRIPTION OF A PREFERRED EMBODIMENT

Figure 5:
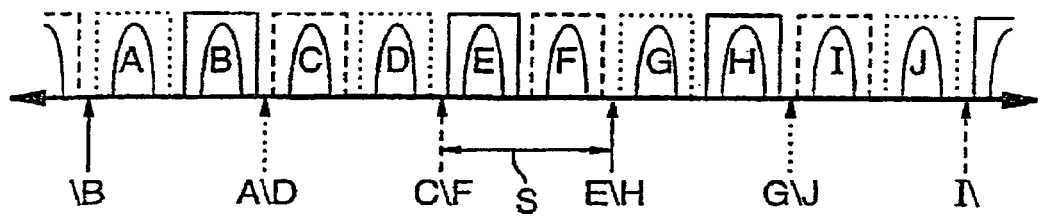
FIGS. 5 and 6 are diagrams illustrating the doubled local oscillator step size achievable according to the present invention.

A significant aspect of the present invention is the basic division of functions between discrete-time (digital) and continuous-time (analog) components characteristic of the invention, which is described with reference to FIG. 1.

In FIG. 1, analog portion 12 of a device 10 according to the present invention receives an incoming signal from a preferably removable/exchangeable antenna 16. A suitable broadband or tunable RF amplifier 18 then amplifies the signal. Alternatively, the invention could also be used to tune an intermediate frequency from previous analog processing, rather than an incoming signal directly from antenna 16 and amplifier 18.

The signal is then split into two signal paths and fed to first and second mixers 20, 22. The first and second mixers 20, 22 are supplied with a quadrature local oscillator signal from a preferably coarse-stepped local oscillator 24. The mixing operation translates to a near-baseband passband an upper high frequency spectrum of interest from above the frequency $F_{LO}$ of the local oscillator 24 and a lower high frequency spectrum of interest from below the frequency $F_{LO}$ of the local oscillator 24, producing I and Q signals in approximate quadrature relation.

The near-baseband passband is sufficiently low to provide substantial efficiency gains in the subsequent digital processing, but does not include baseband. The near-baseband passband is also sufficiently high to allow a fairly relaxed transition from a cutoff at or near DC to the lower edge of the passband. Problems such as self-mixing products and DC offsets and 1/f noise are avoided by high-pass filtering with a relaxed transition band in filters 26 and 28. Unwanted aliasing is prevented by low-pass filtering in filters 26 and 28. The I and Q outputs from the analog portion 16 of the device 10 are then passed to the digital portion 14 of the device 10.

At least three operations are performed within the digital portion 14 of the device 10. First is analog to digital conversion. The I and Q signals are converted individually into digital signals. Second, phase errors (optionally including group delay errors) and amplitude errors between the I and Q channels are corrected, particularly to maximize image rejection at and/or near the frequency of the desired signal, and the channels are combined by a Hilbert transform pair and summing, or filtering with complex coefficients is employed, in order to reject the undesired mixing image, particularly at the frequency of the desired signal. Third, a portion of the now image-rejected signal containing the desired signal is translated to baseband. The second two operations may be performed in various orders or to some extent simultaneously according to the particular design and programming of the digital portion 14 of the inventive device 10.

The above-described division of functions into analog and digital domains, together with the use of the properly located near-baseband passband, provides important advantages. The number of analog components is minimized, and the analog components are employed for those tasks to which they are most suited: the conversion of high frequencies to low frequencies. The digital processing is used only at lower frequencies, allowing lower sampling rates and quantization resolutions to be employed without substantial loss of signal characteristics, resulting in decreased memory, processing power, and electrical power requirements. The near-baseband passband avoids analog processing of signals at or close to DC, thereby avoiding or substantially diminishing problems associated with 1/f noise and DC offsets and self-mixing products. Use of quadrature mixing with subsequent image rejection avoids the need for relatively high-performance image rejection filters in the analog portion. Correction in digital processing of phase and amplitude deviations from the desired quadrature relation allows relaxation of otherwise relatively strict matching and performance requirements for the analog filters. Fine-tuning, if employed, is preferably performed in the digital domain, leaving only coarse-tuning by a coarse-stepped local oscillator to be performed in analog processing, thereby reducing the complexity of the local oscillator and the generation of phase noise.

Another significant aspect of the present invention is that the step size S of the local oscillator is twice as large as would typically be permitted, given the range of the digital fine-tuning employed, or given the channel spacing of the channelized spectrum and the digital channel tuning employed. This is achieved by proper positioning and sizing of the near-baseband passband and the tuning range or channelized tuning/translation range of the digital tuning process, and takes advantage of the fact that complex I, Q signals contain twice the spectral information of a real signal.

As illustrated in FIG. 2, the near-baseband passband P may be defined with reference to a lower frequency $F_1$ and an upper frequency $F_2$. To achieve the preferred effective doubling of the local oscillator step size S, $F_1$ and $F_2$ are chosen such that $F_1 = k \cdot (F_2 - F_1)$, where k is a positive integer, and S is set to $2 \cdot (F_2 - F_1)$. This insures that the center frequency of any desired incoming signal can be translated to within the positive frequency range of $F_1$ to $F_2$ inclusive or the negative frequency range of $-F_1$ to $-F_2$ inclusive by mixing with the appropriate local oscillator frequency. The use of complex I, Q signals allows the positive frequency range to be distinguished from the negative frequency range.

For embodiments of the invention designed to tune essentially any desired frequency from within a given RF range, the digital tuning process employed preferably has a range extending from $F_1 - F_H$ to $F_2 + F_H$, where $F_H$ is an appropriate hysteresis amount greater than or equal to zero, the effects and usefulness of which will be explained hereafter. The near-baseband passband P is then defined so as to extend from $F_1 - F_A$ to $F_2 + F_A$ as shown in FIG. 2, where $F_A$ is a frequency adjustment equal to at least about $W/2 + F_H$, where W is the maximum bandwidth of the desired signals to be received. This ensures that all of the bandwidth of any signal having a center frequency tunable by the digital tuning process will fall within the near-baseband passband.

A device of the present invention designed to tune essentially any frequency can of course be utilized to receive channelized signals. If decreased digital processing is desired in an embodiment designed for channelized signal reception, the full digital tuning capability over the entire near-baseband passband can be restricted to discrete digital tuning in the form of either (1) a translation to baseband from a chosen frequency within the near-baseband passband (preferably the midpoint between $F_1$ and $F_2$), or (2) a step-wise tuning of selected channelized frequencies from the near-baseband passband to baseband. A small amount of fine-tuning may be retained if desired for fine-tuning around the discrete channelized frequency(ies) within the near-baseband passband.

In embodiments of the present invention employing discrete digital tuning, the center frequency of each channel of any given channelized spectrum will be translated to within the frequency range from $F_1$ to $F_2$ inclusive or from $-F_1$ to $-F_2$ inclusive by mixing with one of the various possible local oscillator frequencies.

One possibility for selecting $F_1$ and $F_2$, with reference to which the near-baseband passband may be defined, is choosing $F_1$ and $F_2$ such that $F_2 - F_1 = N \cdot C$ where C is the channel spacing and N is the number of channels to be contained within the near-baseband passband. $F_1$ and $F_2$ may be further chosen, along with the local oscillator frequency, such that $F_1$ and $F_2$ each fall at the midpoint between adjacent channels after translation of the channel frequencies by mixing with the local oscillator signal. This is possible where the permissible local oscillator frequencies are at frequencies one-half of a channel spacing C displaced from integer multiples of the channel spacing, and is illustrated for the case N=1 in FIG. 3.

In FIG. 3, adjacent channels of bandwidth W have been down-converted by mixing with the local oscillator signal. $F_1$ and $F_2$ fall between adjacent down-converted channels. The near-baseband passband P extends from $F_1 - F_A$ to $F_2 + F_A$, where $F_A$ is a frequency adjustment equal to $\frac{1}{2}(W - C + W_{ft})$, where $W_{ft}$ is the width of the digital fine-tuning, if any, provided for fine-tuning around each channel.

FIG. 4 shows the near-baseband passband P in a channelized embodiment using with N=3, W=C, $W_{ft}=0$, and $F_H=0$. The local oscillator frequency is in this case an integer multiple of the channel spacing. The near-baseband passband P is defined with reference to $F_1$ and $F_2$ and the full-range digital tuning frequency adjustment $F_A$, which is equal to $(\frac{1}{2}) \cdot (W + W_{ft})$. $F_2 - F_1$ in this case equals $(N-1) \cdot C$.

Figure 26:
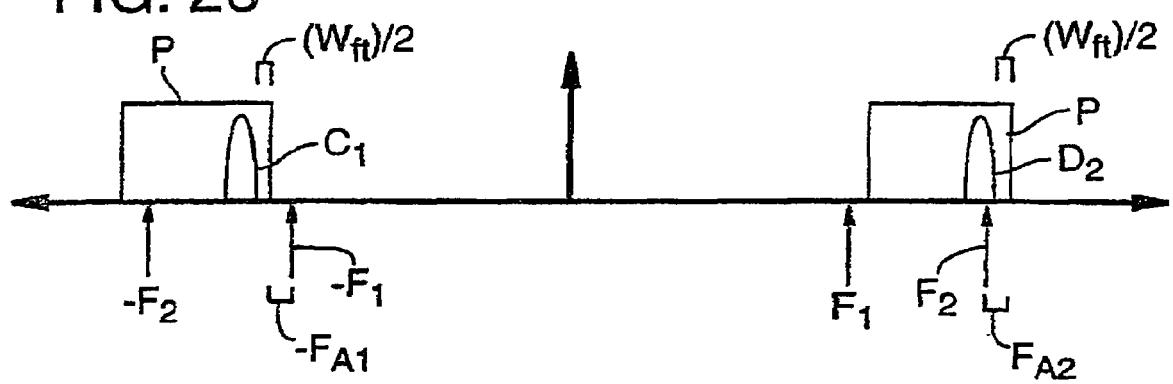
FIG. 26 is an additional diagram illustrating the use of the near-baseband passband with channelized frequency spectra.

The decreased digital processing realized with channelized operation may be obtained even with irregular intervals between channels or with local oscillator step sizes not evenly divisible by the channel spacing or with channels not located at integer multiples of the channel spacing. A generalized case is illustrated in FIG. 26. For a given channelized spectrum and a given set of possible local oscillator frequencies, the center frequency of every channel is translatable by one of the local oscillator frequencies to within the range $F_1$ to $F_2$ inclusive or the range $-F_1$ to $-F_2$ inclusive. The channel having a center frequency after such translation the absolute value of which is closest to (but not greater than) $F_2$ is used to determine the upper edge of the near-baseband passband P. The center frequency of such channel after translation may be either negative or positive, but is illustrated in FIG. 26 as positive channel $C_2$. The upper edge of the near-baseband passband P (the edge with the greatest absolute value) is then located at the edge of the bandwidth of channel $C_2$ furthest from DC, plus another $W_{ft}/2$ from DC, which is half the width of any digital fine tuning range. Similarly, the channel having a center frequency after translation the absolute value of which is closest to (but not less than) $F_1$ is used to determine the lower edge of the passband. The center frequency of such channel after translation may be either negative or positive, but is illustrated in FIG. 26 as negative channel $C_1$. The lower edge of the near-baseband passband P (the edge with the least absolute value) is then located at the edge of the bandwidth of channel $C_1$ closest to DC, plus another $W_{fi}/2$ toward DC. The resulting frequency adjustments $F_{A1}$ and $F_{A2}$ are shown in FIG. 26.

Note that in the above examples and throughout the specification and claims, it should be understood that the near-baseband passband refers to that portion of the frequency spectrum to which signals of interest are to be translated in continuous time for further processing in discrete time. The actual physical passband created by the frequency response of the filters 26 and 28 of FIG. 1 may, of course, be larger than the near-baseband passband itself, and indeed it is preferred that the actual passband be somewhat larger, so that the corners of filters 26 and 28 do not appear within the near-baseband passband. Preventing the corners from appearing in the near-baseband passband reduces group delay variation that can cause degradation in image rejection and can worsen intersymbol interference.

Whether in an embodiment with essentially continuous digital fine-tuning or with channelized digital tuning, the frequencies $F_1$ and $F_2$ are selected such that $F_1 = k \cdot (F_2 - F_1)$, where k is a positive integer. Most preferred is k=1 as in FIG. 2, but other values can be used, such as k=2 as shown in FIG. 4. The effective doubling of the permissible step size S of the local oscillator results in part from utilization of this equation as illustrated below with respect to FIGS. 5 and 6.

For a given local oscillator frequency $F_{LO}$, both an upper high frequency spectrum of interest and a lower high frequency spectrum of interest are translated to the near-baseband passband. By means of image-rejection processing employed in the digital domain, either the near-baseband image of the upper high frequency spectrum of interest or the near-baseband image of the lower high frequency spectrum of interest may be rejected, allowing selection of either the upper high frequency spectrum of interest or the lower high frequency spectrum of interest for further processing. Because of the positioning and size of the near-baseband passband and associated digital tuning, whether continuous fine-tuning or stepwise tuning, alternate selection of the upper and lower high frequency spectra of interest can be used to provide non-redundant coverage of the broadband frequency spectrum from which the desired signal is to be received. Any desired frequency may then be translated to the near-baseband passband with the local oscillator step size S set to twice the digital tuning range, i.e., S set equal to $2 \cdot (F_2 - F_1)$.

FIG. 5 shows a portion of the positive frequency spectrum graphed on a linear scale. Each possible value of $F_{LO}$ is indicated with an arrow and labeled with a letter or letters and a backslash. The letters are also used to label a number of frequency regions with a channelized signal in each. This represents an embodiment for a channelized spectrum with a near-baseband passband sized to fit one channel, as in FIG. 3. The letters labeling each possible value of $F_{LO}$ correspond to the letters labeling the regions translated to the near-baseband passband by that value of $F_{LO}$. If $F_{LO}$ is at A\D, for example, regions A and D are translated to the near-baseband passband. The letter to the left of the backslash corresponds to the letter labeling the lower high frequency spectrum of interest for a given $F_{LO}$, while the letter to the right corresponds to the letter labeling the upper high frequency spectrum of interest for that given $F_{LO}$.

To translate to the near base-band passband the channelized signal frequency within region F, for example, the local oscillator frequency $F_{LO}$ would be set to the C\F position. The desired signal frequency would then fall within the upper high frequency spectrum of interest of the local oscillator frequency. The image of region C, the lower high frequency spectrum of interest, would be rejected by the digital image rejection processing, leaving F as the selected region.

Similarly, to tune the channelized signal frequency within region G shown in FIG. 5, the local oscillator frequency $F_{LO}$ would be set to the G\J position. The desired signal frequency would then fall within the lower high frequency spectrum of interest of the local oscillator frequency, and the image of region J would be rejected by the digital image rejection processing, leaving G selected.

Figure 6:
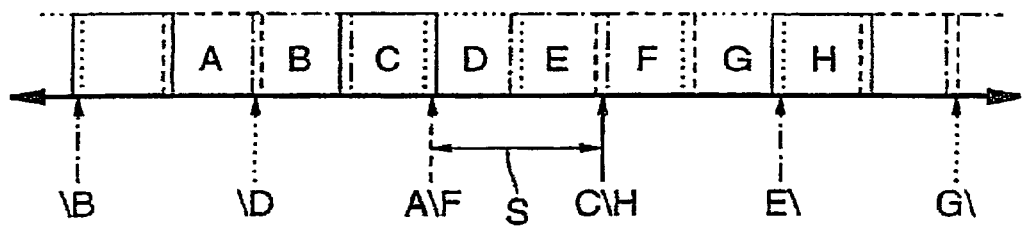

While k=1 is preferred as noted above, other values are possible such as k=2, illustrated in FIG. 6 for an embodiment with essentially continuous digital fine-tuning. The upper and lower high frequency spectra of interest are now each about two tuning ranges separated from the applicable local oscillator frequency $F_{LO}$, but the same complete coverage, with a step size $S = 2 \cdot (F_2 - F_1)$, is provided. To tune a signal frequency within region C, for example, the local oscillator frequency would be set to the C\H position, and the lower high frequency spectrum of interest would be selected.

The proper $F_{LO}$ to receive a given desired signal frequency $F_t$ may be found by any appropriate method. For example, the proper $F_{LO}$ may be found generally by setting NLO=floor($F_t/S+\frac{1}{2}$), which is the factor NLO such that NLO·S is the nearest $F_{LO}$ to the desired signal frequency $F_t$. If NLO·S $\geq F_t$, the proper $F_{LO}$ to employ to translate $F_t$ to the near-baseband passband is then given generally by (NLO+$(-1)^k$·floor$(k/2+\frac{1}{2})$)·S, with $F_t$ found in the upper high frequency spectrum of interest if $(-1)^k < 0$, and in the lower high frequency spectrum of interest otherwise. Similarly, if NLO·S $\leq F_t$, the proper $F_{LO}$ is given by (NLO$-(-1)^k$·floor$(k/2+\frac{1}{2})$)·S, with $F_t$ in the upper high frequency spectrum of interest if $(-1)^k > 0$, and in the lower high frequency spectrum of interest otherwise. (The ambiguity in $F_{LO}$ selection at NLO·S=$F_t$ is caused by the overlap of adjacent high frequency spectra of interest as seen in FIG. 6, which allows a desired signal of frequency $F_t$ equal to NLO·S to be translated to the near-baseband passband by either of two possible values of $F_{LO}$.)

To avoid having to repeatedly change the value of NLO when fine-tuning around a signal frequency $F_t$ about equal to NLO·S, the hysteresis amount $F_H$ for essentially continuous fine-tuning embodiments may be set to a value greater than zero. This allows fine tuning on both sides of a signal frequency $F_t$ equal to about NLO·S with only one local oscillator frequency $F_{LO}$, and widens each high frequency spectrum of interest by $2 \cdot F_H$. If a desired frequency $F_t$ moves out of a first widened high frequency spectrum of interest associated with a first $F_{LO}$, a second $F_{LO}$ is selected. If $F_t$ then moves back into the first widened high frequency spectrum of interest, the second $F_{LO}$ is maintained until $F_t$ is within the first widened high frequency spectrum of interest by the distance $F_H$. Thus excessive switching from one $F_{LO}$ to another is prevented.

If the invention is used to tune an intermediate frequency from previous analog processing, either a local oscillator in the previous analog processing or the quadrature local oscillator 24 may be varied and the other local oscillator set to a fixed frequency. The effective doubling of the permissible step size S of the varied local oscillator is retained in either case through the alternate selection of the upper and lower high-frequency spectra of interest.

While the actual frequencies $F_1$ and $F_2$, selected as described above, will vary with the particular application, it is currently preferred that $F_1$ be at least about W and that, in general, $F_2$ be not more than about 150 kHz. In some applications, however, $F_2$ may be many times this generalized upper limit. It is currently preferred that $F_2-F_1$ be at least about 20 kHz. In embodiments with full-range digital tuning, it is currently preferred that $F_2-F_1$ be within the range of about 3·W to about 5·W.

Another significant aspect of the present invention is the preferred use of a type-III Hilbert transform in the image rejection processing in the digital domain. A type III Hilbert transform enjoys nearly a 2:1 efficiency advantage over a similar standard type IV Hilbert transform, because every other impulse response sample is zero. The performance envelope of the type III Hilbert transform is symmetrical and centered on $f_s/4$ (where $f_s$ is the sampling frequency employed), falling off symmetrically approaching DC and $f_s/2$. While the performance of the type III falls off relative to the type IV as frequencies approach the Nyquist frequency of $f_s/2$, the present invention avoids any disadvantage from this characteristic as will be seen below with respect to FIG. 7.

Due to the preferred spacing from DC of the near-baseband passband of the present invention as illustrated for example in FIG. 2, the near-baseband passband is sufficiently separated from DC for an efficient and accurate Hilbert transform to be performed. The relatively wide transition band to DC also affords relaxed filter specifications. To take advantage of the type III transform's efficiency and to provide even more relaxed filter specifications, the present invention preferably employs a type III Hilbert transform with a sampling rate R entering the Hilbert transform equal to $2 \cdot (F_1+F_2)$. This is equivalent to centering the near-baseband passband at R/4. Some of the advantages of this arrangement are illustrated for the case k=1 in FIG. 7.

Figure 7:
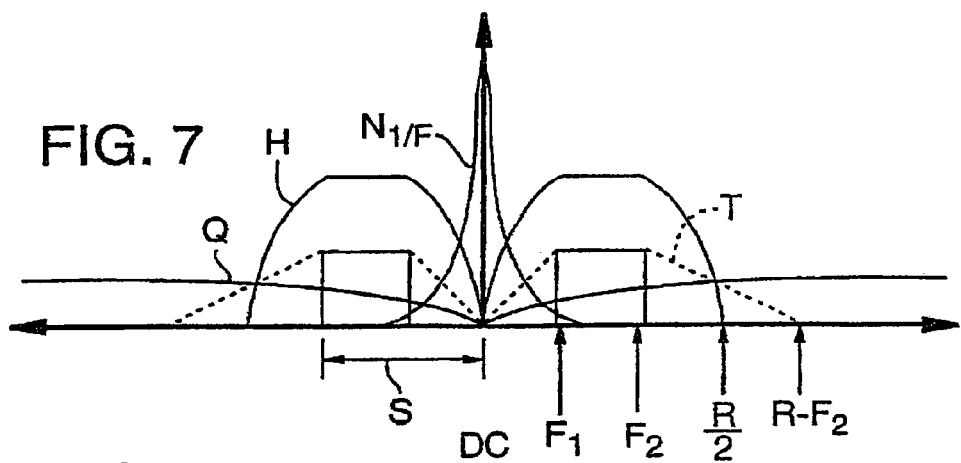
FIG. 7 is a diagram showing the preferred size and location of the near-baseband passband of the present invention in relation to various characteristics of various preferred elements of the present invention.

FIG. 7 shows the near-baseband passband P of the present invention located to encompass a digital tuning range between $F_1$ and $F_2$ with $F_1=k \cdot (F_2-F_1)$ with k being a positive integer, in this case 1. The step size S of the analog local oscillator is also shown for reference. The use of a type III Hilbert transform with an entering sampling frequency $R=2 \cdot (F_1+F_2)$ results in the illustrated performance curve H for the preferred type III Hilbert transform. The performance curve H is symmetrical with the best performance at the location of the near-baseband passband P, with symmetrically reduced performance toward DC and the Nyquist frequency of R/2.

The near-baseband passband is also situated so as to substantially avoid 1/f noise represented by the $N_{1/f}$ spectrum shown, and quantization noise Q from a presently most preferred delta-sigma analog to digital conversion. The transition bands T are also sufficiently broad to relax filtering requirements in both the analog and digital domains as will be shown in greater detail below.

A pair of preferred embodiments of the device of the present invention implementing the methods and having the characteristics and advantages discussed above are shown in greater detail in FIG. 8. The device 10 shown in FIG. 8 corresponds to the device 10 shown in FIG. 1, but with details of presently preferred embodiments shown in the digital portion 14 of FIG. 8. Accordingly, analog portion 12 shown in FIG. 8 is as described above with reference to FIG. 1.

The analog I and Q signals are received into digital portion 14 from the analog portion 12 of the device 10 and are converted into digital signals by delta-sigma modulators 30, 32 most preferably third-order delta-sigma modulators, with one-bit wide output. The delta-sigma modulators sample the I and Q signals at an over-sampling rate $R_O$. Decimation filters 34 and 36 filter the output of the delta-sigma modulators so as to substantially reject frequencies which would alias into the near-baseband passband on decimation, and decimate the signal, such that the output sample rate is equal to R, the desired input sampling frequency at a Hilbert transform pair, comprised of a Hilbert transform 38 and allpass filter 40, which follows.

Figure 8:
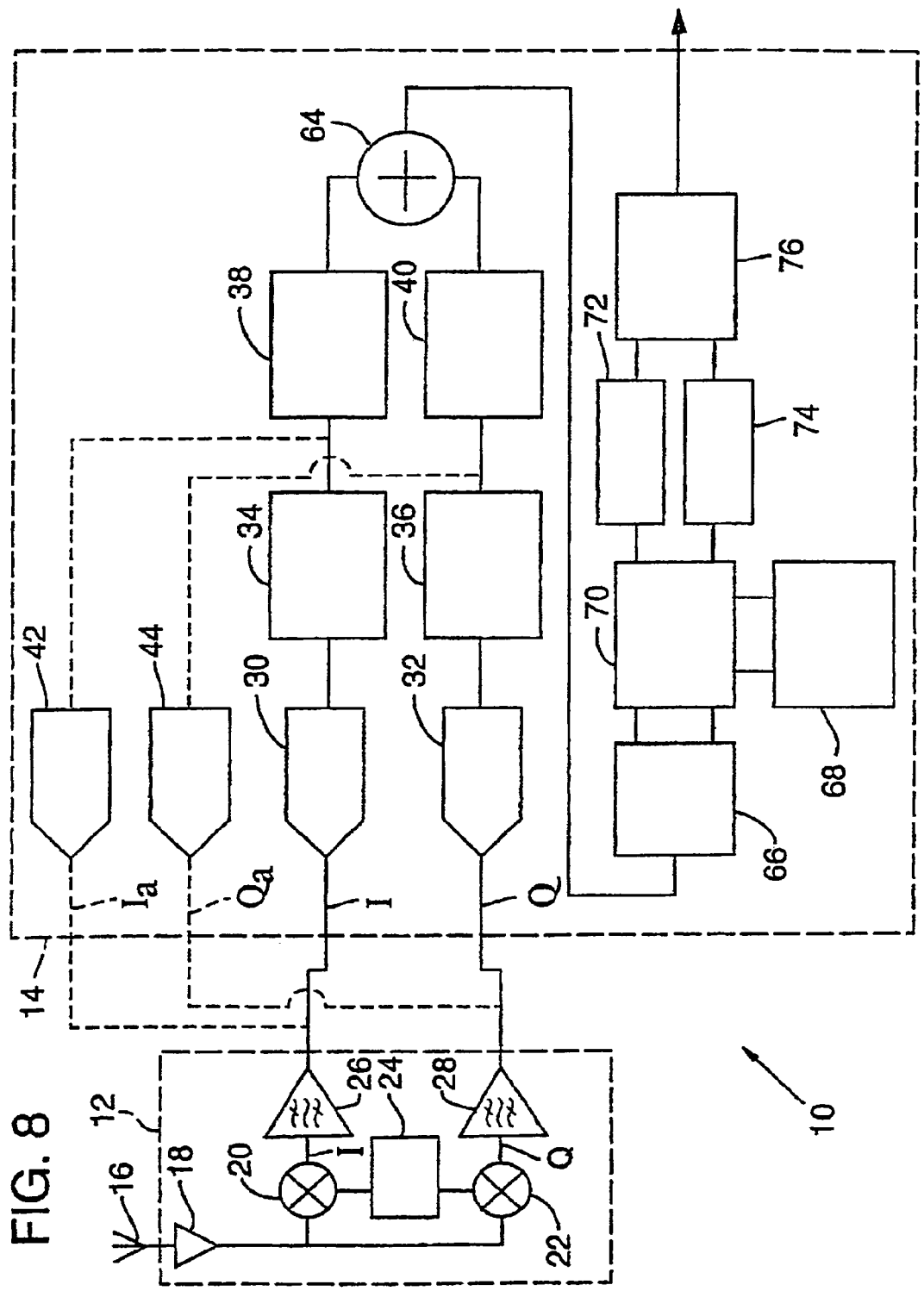
FIG. 8 is a diagram of presently preferred embodiments of the present invention.

An alternate embodiment, shown in FIG. 8 by the dashed-line alternate signal paths $I_A$ and $Q_A$, does not employ oversampling. Instead, the I and Q signals are sampled by analog to digital converters 42 and 44 at the rate R, the input sampling frequency at the Hilbert transform pair 38 and 40, and converted into digital signals preferably 12 to 16 bits wide, depending on the dynamic range requirements of the application. Thus no decimation is required between analog to digital converters 42 and 44 and Hilbert transform pair 38, 40. For this alternate embodiment, the near-baseband passband of the present invention provides somewhat relaxed anti-aliasing lowpass filter specifications, as illustrated in FIG. 9.

Figure 9:
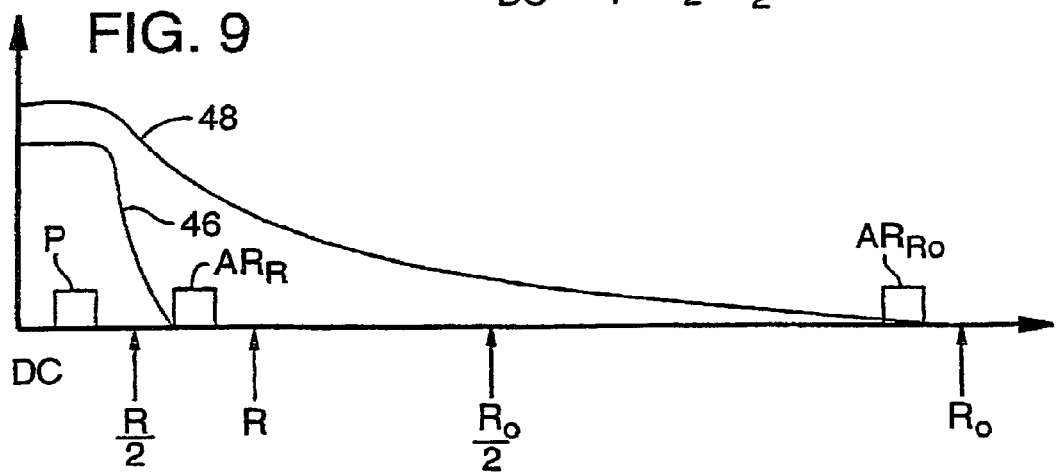
FIG. 9 is a diagram showing certain aliasing regions of the near-baseband passband together with highpass frequency response curves for filters for use in the present invention.

The near-baseband passband P of the present invention, for the case k=1, is shown in FIG. 9. P ends at $(k+1) \cdot S/2+F_A$. The region $AR_R$ is the first (lowest frequency) region to alias into P at a sampling rate of R. $AR_R$ begins at $R-(k+1) \cdot S/2-F_A$. Accordingly, the passband of the anti-aliasing filter represented by response curve 46 must extend at least to $(k+1) \cdot S/2+F_A$, while the stop band must begin at or before $R-(k+1) \cdot S/2-F_A$. This prevents aliasing into P while allowing a fairly relaxed transition band between the passband and stop band. A highpass filter would preferably be employed with a passband beginning at the lower edge of P, which is given by $k \cdot S/2-F_A$. These two filters together then comprise filter 26, for example, in FIG. 8. The lowpass filter can be an eighth order switched-capacitor elliptical lowpass filter, for example. The passband of the filter 26 preferably extends even beyond the edges of P such that the corners of the filter, with their typically large group delay, are not within P.

The relatively high order low-pass filters typically needed for moderately relaxed transition bands such as the transition band in response curve 46 of FIG. 9 can cause less efficient image rejection due to small variations in pole and zero locations between the filters 26 and 28 in the device 10 of FIG. 8. In the most preferred embodiment shown in FIG. 8 by the I and Q solid line signal paths, oversampling allows use of much lower order anti-aliasing filters, with corresponding improvements in image rejection.

The relaxed anti-aliasing filter transition band obtainable with oversampling is illustrated in FIG. 9, where $R_O$ is the oversampling sampling rate, with $R_O=M \cdot R$ where M is the rate of oversampling. M=3 is shown for illustration purposes in FIG. 9. $AR_{Ro}$ is then the first aliasing region, i.e., the lowest frequency region to alias into P at a sampling rate of $R_O$. $AR_{Ro}$ begins at $R_O-(k+1)S/2-F_A$. Accordingly, the stopband of the anti-aliasing filter represented by response curve 48 must begin at or before $R_O(k+1) \cdot S/2-F_A$ with the same passband region as response curve 46. Response curve 48, together with oversampling, thus prevents aliasing into P while allowing a very relaxed transition band between the passband and stop band of the anti-aliasing filter. In practice, even greater oversampling rates than 3 are desirable, with M=32 currently most preferred. A 2-pole Chebychev type I low pass filter is then preferred for the low pass filter portion of filters 26 and 28.

Note that, as discussed with reference to FIG. 26, the frequency adjustment FA may have differing values at the upper and lower edges of the near-baseband passband P.

In the most preferred embodiment, decimating filters 34 and 36 follow the delta-sigma modulators 30 and 32, respectively. One of the decimating filters 34 and 36 preferably includes a group delay correction. The output of the delta-sigma modulators 30 and 32 is preferably one bit wide, allowing group delay correction to be implemented with a variable shift register in the signal path. One-bit signal width, together with the near-baseband passband and other features of the present invention, also makes practical an efficient single stage implementation of filters 34 and 36 with no multiplication required.

Figure 10:
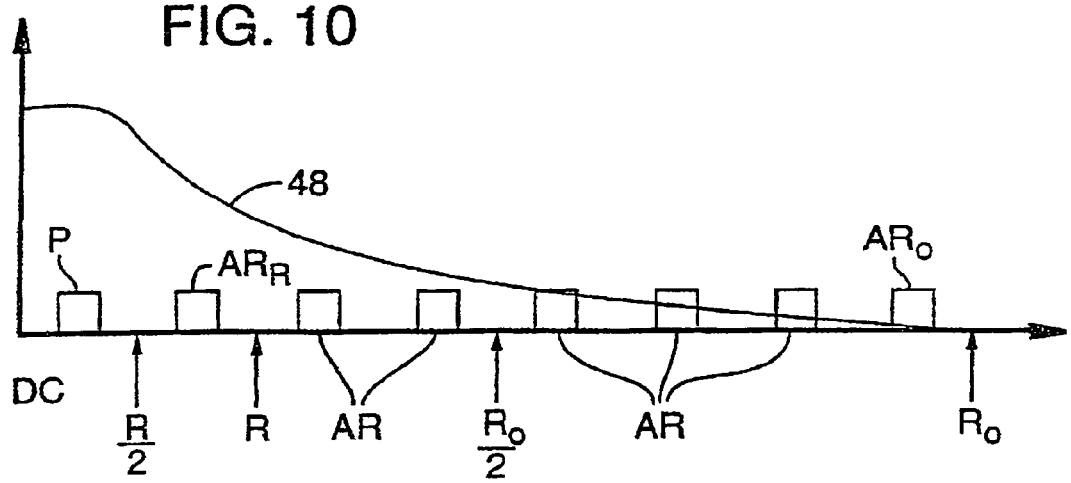
FIG. 10 is a diagram showing additional aliasing regions of the near-baseband passband according to an embodiment of the present invention.

The aliasing regions of concern in the design of filters 34 and 36 are illustrated for example in FIG. 10. The output of filters 34 and 36 is to be sampled at a rate R which is equal to $R_O/M$, where $R_O$ is the over-sampling sampling rate. M=3 is used in FIG. 10 for illustration purposes. The first aliasing region $AR_R$ is the first, i.e. lowest frequency, region to alias into P due to the sampling at rate R. Subsequent aliasing regions AR are also shown in FIG. 10 to the right of $AR_R$. The desired decimating filter should thus have a passband at P and stopbands of at least the same width as P at each aliasing region. All other frequency regions may be left unconstrained in the filter design process. Leaving regions which do not alias into the near-baseband passband P unconstrained, particularly with the size and position of P relative to R as preferred in the present invention, allows significant reduction in filter order and/or length such that a single stage decimation filter with good performance and reasonably low processing and memory requirements can be implemented.

Figure 11:
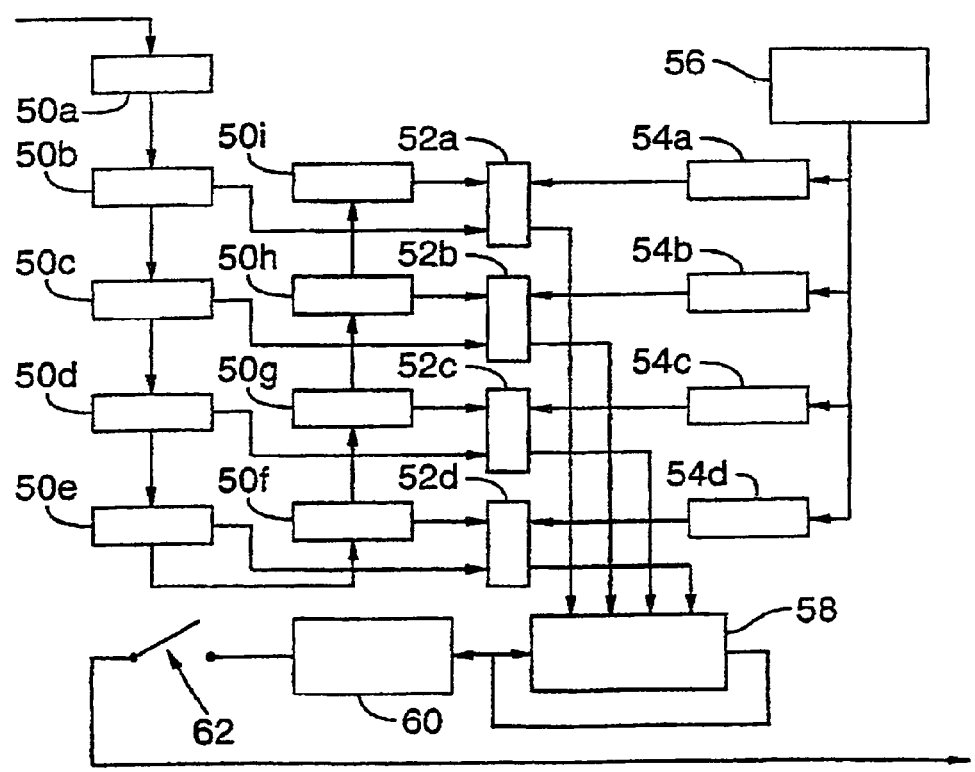
FIG. 11 is a diagram of a preferred embodiment of a decimating filter for use in an embodiment of the present invention.

A preferred design for a single stage decimation filter for use as filter 34 and/or 36 is shown in FIG. 11. The filter includes: 32-bit registers 50a-50i, operators 52a-52d, look-up tables 54a-54d with a look-up table address generator 56, a 22-bit accumulator 58, and a truncator 60 and a decimator 62.

The 32-bit register 50a receives signal bits from the associated upstream one-bit delta-sigma modulator until the register 50a is full. Each time register 50a is full, the contents of each of the 32-bit registers 50a-50h are shifted into the 32-bit registers 50b-50i respectively. Because of the one-bit signal width and the symmetrical filter coefficients and folded-over filter architecture, the operators 52a-d can be used to efficiently determine the filter output without multiplication.

In the operators 52a-d, each of the 32 signal bits from one associated register is exclusive or-ed with the signal bit at the same distance from the center of the filter's delay line from the other respectively associated register. If the bits are not equal, a zero is added to the contents of the accumulator 58. If the bits are equal and positive, twice the value of the applicable coefficient is added to the contents of the accumulator 58, and if the bits are equal and negative, negative twice the value of the applicable coefficient is added to the contents of the accumulator 58. This can be easily implemented by storing not the actual filter coefficient values in the look-up tables 54a-54d, but twice the actual coefficient values. Then if two signal bits compared in the operator 52a for example are equal, the sign of one can be used as the sign bit to be sent to the accumulator 58 along with the doubled coefficient value from the look-up table 54a.

Each of operators 52a-52d operates in parallel on two of the 32-bit registers 50b-50i, and sends its output to accumulator 58 in parallel. Once all coefficients have been summed in accumulator 58, truncator 60 takes only the 16 most significant bits from accumulator 58. Decimator 62 represents the decimation performed in the operation of this filter.

Table I below contains Matlab® code for generating filter coefficients for the filter illustrated in FIG. 11 for use with the near-baseband passband of the present invention with k=1 and the near-baseband passband centered at ¼ of the Nyquist frequency. (Matlab® is software for digital signal processing analysis and development available from The MathWorks, Inc., Natick, Mass., U.S.A.) In the code in Table I, the variable fs is the sampling frequency entering the Hilbert transform and is set to 128 kHz. N is the filter order, which is set to 255, resulting in 256 FIR filter taps, which number is desirable as a power of 2 giving easier implementation in a DSP, and because it provides sufficient taps to significantly reduce noise at each alias of the near-baseband passband. R is the weight of the stopband constraint versus passband constraint, and is set to 100, resulting in very high stopband rejection at the expense of some passband ripple. Mds is the over-sampling and decimation ratio, and is set to 32.

Table II below gives an example of doubled filter coefficient values for use in the look-up tables 54a-54d. Note that look-up tables 54a and 54b require 32×13 bits of storage, while look-up table 54c needs 32×14, and look-up table 54d needs 32×16.

Figure 12:
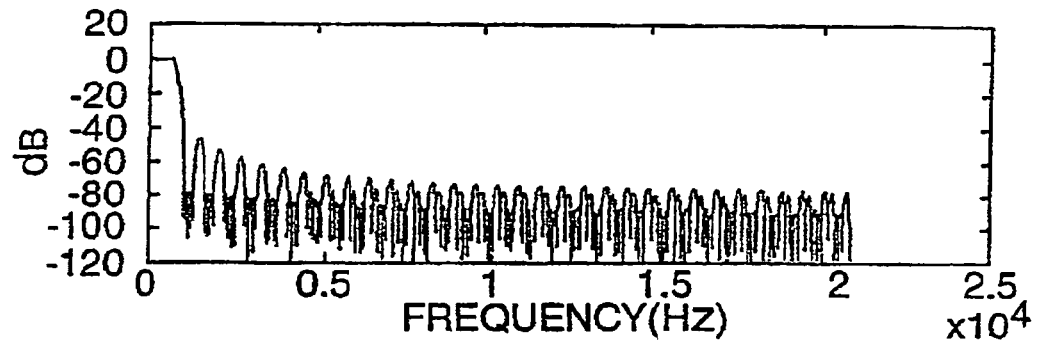
FIG. 12 is a simulated frequency response curve of the filter of FIG. 11.
Figure 13:
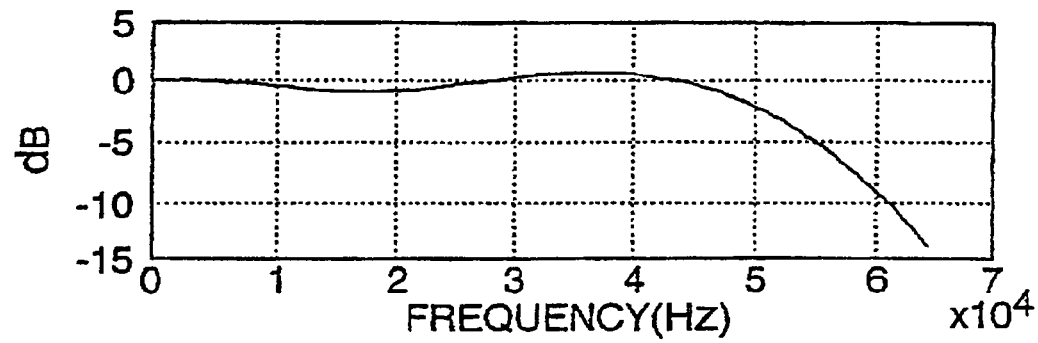
FIG. 13 is the simulated frequency response curve of FIG. 12 shown on a smaller scale.

The resulting simulated frequency response of the filter in FIG. 11 is shown in FIGS. 12 and 13. In FIG. 12, the filter response at the near-baseband passband, located at 21.33-42.67 kHz in this example, may be seen. In FIG. 13 with a smaller scale, the repeating stopbands at aliasing regions of the near-baseband passband may be seen, including stopbands at about 80-100 kHz, 140-160 kHz, etc.

Figure 14:
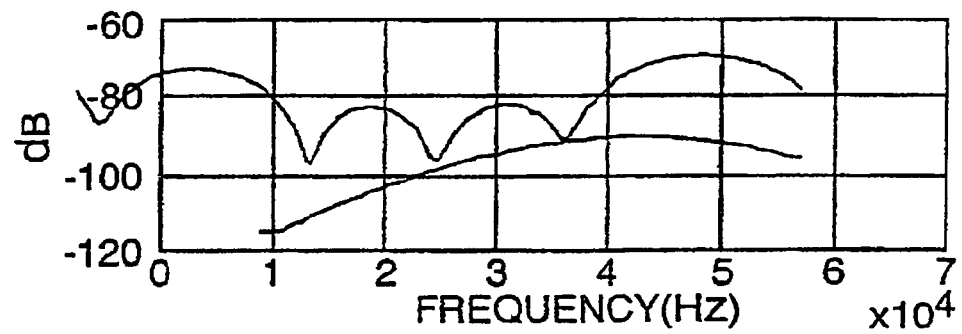
FIG. 14 is a simulation plot of quantization noise both with and without aliased quantization noise.

One important criteria for judging the performance of the filter of FIG. 11 is the reduction of quantization noise from the delta-sigma modulator, particularly from higher aliasing regions which would alias into the near-baseband passband. FIG. 14 shows the noise due to quantization after filtering and decimation without (lower trace) and with (upper trace) the aliased quantization noise. Noise floors in the near-baseband passband located in this case at 21.33-42.67 kHz are still at quite acceptable levels, even with the addition of the aliased noise.

Figure 15:
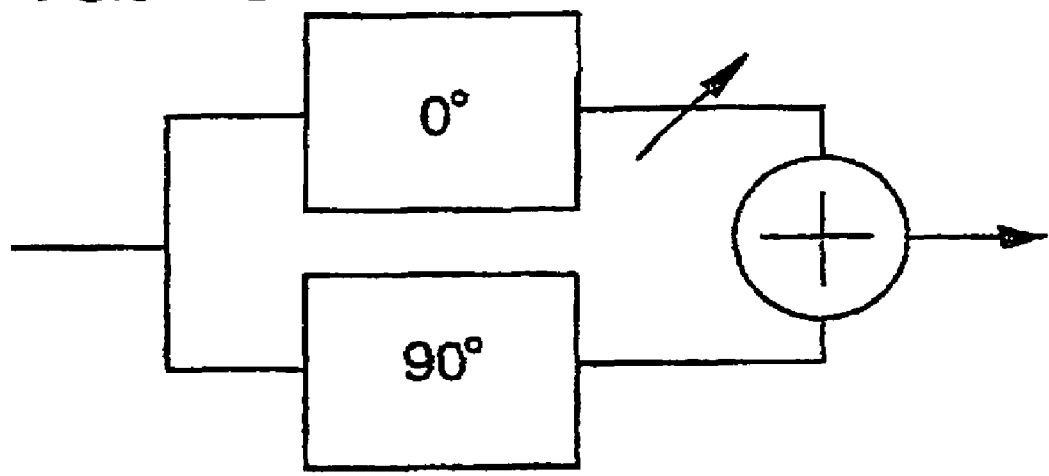
FIG. 15 is a diagram illustrating the operation of a Hilbert transform modified according to the present invention.

The preferred design of the Hilbert transform 38 of the device 10 in FIG. 8 is of course type III, but with at least one modification. Type III Hilbert transforms have an odd number of taps, with the center tap, and taps displaced an even number of taps from the center tap, set to zero. The Hilbert transform 38 is modified by having a variable non-zero coefficient present at the center tap, i.e., at the sample of its impulse response the index of which corresponds to half the length of the transform delay line. This modification enables the Hilbert transform 38 to function as if in parallel with an all pass filter with variable gain, as shown schematically in FIG. 15. As the contribution from the allpass portion increases or decreases from zero, the phase change caused by the Hilbert transform is varied up or down from 90 degrees, allowing efficient correction of phase errors. The other coefficients of the Hilbert Transform may also be varied along with the central coefficient to implement correction of amplitude errors between the I and Q channels. Variable gain for amplitude error correction may also be implemented in the allpass filter 40 if desired.

Figure 16:
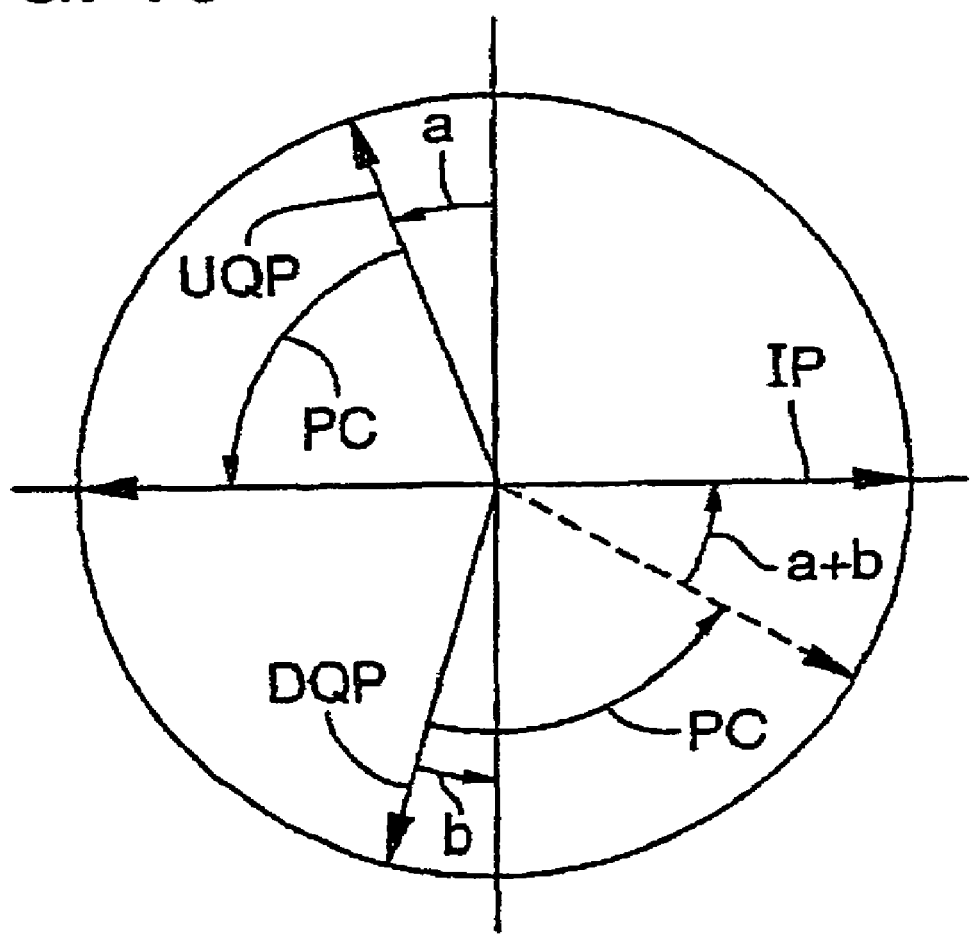
FIG. 16 is a diagram illustrating the presently preferred method of correcting phase errors used in the present invention.

In implementing any type of error correction between the I and Q channels, the errors should be corrected not to maximize coherence of the desired signal but to maximize rejection of unwanted mixing images at and near the frequency of the desired signal. This is illustrated for phase error correction in FIG. 16. An undesired Q phasor UQP is already displaced by amount "a" toward an exact opposite phase relation with the I phasors IP. The Hilbert transform is accordingly employed to rotate the undesired Q phasor UQP and the desired Q phasor DQP by a phase correction amount PC such that PC=90°−a. This rotation moves UQP into direct phase opposition to the I phasors IP, while DQP is not completely phase corrected, being out of phase by amount "a" plus amount "b."

All error correction between the I and Q channels is preferably implemented by running a characterization of each device upon completion of device fabrication, and then storing desired correction factors in a memory associated with the digital portion of the device. Other techniques such as techniques to continuously detect and correct such errors may also be employed, if desired. Temperature sensing capability may also be provided if desired, such that correction factors may be dependent on temperature for optimized image rejection under various climatic conditions.

Allpass filter 40 is designed with nominal group delay equal to the group delay of Hilbert transform 38. The Hilbert transform 38 or the allpass filter 40 is also enabled to change the sign of its output, in order to switch from rejecting the image of the upper high frequency spectrum of interest to rejecting the image of the lower high frequency spectrum of interest, and vice versa. As explained above, this switching, combined with the correct step size S of the local oscillator 24 and with an appropriately sized and located digital tuning range and/or near-baseband passband, results in twice the local oscillator step size S that would otherwise be possible for a given tuning range or a given channel spacing of a channelized spectrum.

Particularly for the embodiment of the device 10 in FIG. 8 employing the alternate signal paths $I_a$ and $Q_a$, group delay correction may also be performed in the Hilbert transform pair, if desired, by providing the allpass filter 40 with variable coefficients corresponding to variably offset samples of the sinc function. (The sinc function is defined as:)

$$\mathrm{sinc}(x) = \begin{cases} x = 0: 1 \\ x \ne 0: \dfrac{\sin(x)}{x} \end{cases}$$

Figure 17:
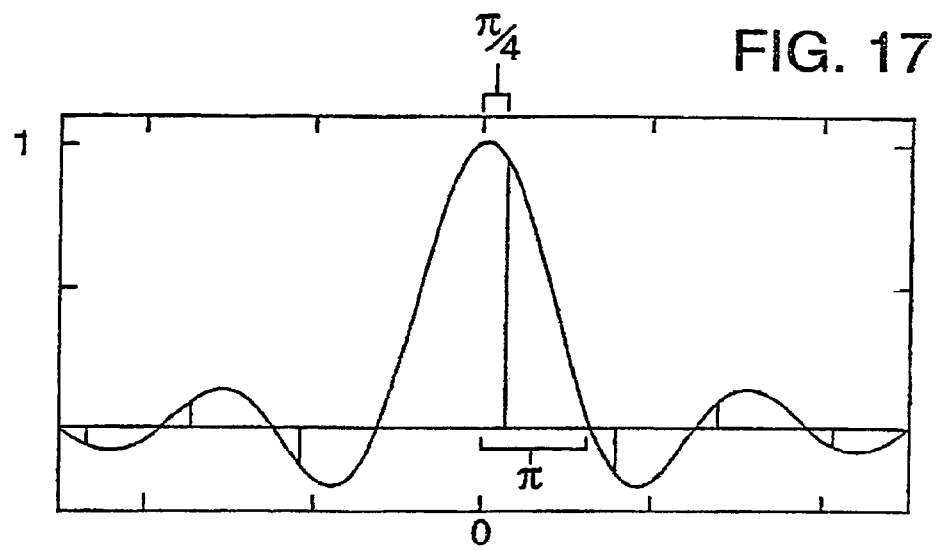
FIG. 17 is a diagram illustrating the generation of coefficients for a variable group-delay allpass filter usable in an embodiment of the present invention.

For zero time shift, the coefficients are given by samples of the sinc function at zero+nπ with n an integer, which results in values of zero everywhere except at n=0, where the sinc function returns a value of 1. Coefficients for a time offset equal to ¼ of one sample at any given sampling frequency may be generated by sampling the sinc function at nπ/4, the central 7 samples of which are shown in FIG. 17. These seven samples give seven coefficient values, with nπ/4 more obtainable as desired by extending the sinc function sampling further in both directions. An appropriate window (such as Hamming, Blackman, or Kaiser) should, of course, be applied to the coefficient values.

Table III below contains Matlab® code for generating the coefficients for the modified Hilbert transform 38 of FIG. 8. In the code, fs is the variable for the sampling frequency entering the Hilbert transform and is set to 128 kHz. The fbw variable represents the bandwidth of the signal of interest, in this case set to 6400 for an 8000 bps QPSK square-root raised-cosine digital signal with an excess bandwidth setting (Beta) of 0.6. The fref variable is a reference frequency of the local oscillator equal to the local oscillator step size which is in this case 42.67 kHz. The fref variable is used in this code to define the passband of the transform according the preferred embodiment. Nh is the filter order, set to 16, resulting in 17 filter taps. (Note that this code applies the transform to the Q channel rather than the I channel—either is fine, as long as the other channel has a 0° allpass.)

After the Hilbert transform pair 38, 40 of the device 10 of FIG. 8, the signals from the I and Q channels are combined by adder 64 resulting in a real, image-rejected near-baseband signal. This signal is fed to a variable band-pass decimating filter 66.

The variable band-pass decimating filter 66 is designed by first designing a prototype filter to have a passband of width W straddling DC, where W is the bandwidth of the desired signal. Similarly to the preferred embodiment of decimating filters 34 and 36, stopbands also of width W are defined for the prototype filter only at locations aliased to the passband by the decimation sampling rate $R_D$. Transition bands may again be left unconstrained during filter design. To provide adequate transition bandwidth while preventing undesired aliasing, $R_D$ must be somewhat greater than W.

Once the prototype filter coefficients are obtained, the position of the passband and the stop bands are varied as desired by multiplication of the filter coefficients by a complex exponent to select from the near-baseband passband a desired signal spectrum of width W. The aliasing caused by the decimation then translates the selected spectrum to within $R_D/2$ of baseband. The variable band-pass decimating filter thus performs a tuning function with a resolution of $R_D/2$.

Matlab® code for determining the coefficients of a filter useable as the variable bandpass decimating filter 66 is presented below in tables IV and V. The code in table IV determines the coefficients for a prototype filter with a passband at DC of width W and seven stopbands of width W at intervals of $R_D$ to either side of DC. In the code in table IV, N is the filter order and is set to 63, resulting in 64 FIR filter taps, providing adequate interference attenuation with a power of 2 length which is typically more easily implemented in a DSP. R is the relative emphasis on stopband performance relative to passband performance and is set to 50, resulting in good stopband rejection with reasonable levels of passband ripple. Variable f1 represents the sampling frequency at the Hilbert transform pair and is set to 128 kHz. Variable f2 represents the output sampling frequency of filter 66 and is set to 16 kHz, giving a decimation ratio of M=8. Variable fbw represents the bandwidth of the signal of interest, in this case a 8000 bps QPSK square-root raised-cosine digital signal with an excess bandwidth setting (Beta) of 0.6.

The code in table V adjusts the coefficients generated in the code in table IV, which are contained in variable b. Variable fs is the sampling frequency at the Hilbert transform pair, set to 128 kHz here. Variable fshift is the frequency to which the passband of the filter 66 is to be shifted.

Final fine-tuning is performed after filter 66 by fine-shifting by mixing with a complex exponential signal. This fine shifting brings the desired signal to baseband from the location within $R_D/2$ of baseband to which it was aliased by filter 66. The complex exponential signal is supplied by a digital quadrature local oscillator 68 and mixed with the complex signals by digital mixer 70. The complex signals are then filtered and decimated at a decimation rate of M=2 by filters 72, 74 matched to the pulse of the desired signal, which filters reject frequencies in the transition bands of the variable bandpass decimating filter and in regions aliasing into the desired signal. Significant suppression of transition bands is thus effectively postponed until the signal reaches filters 72, 74, at which point the sampling frequency has been reduced to $R_D$=R/8, and the spectrum of interest has been reduced to within $R_D/2$ of baseband, allowing for relatively efficient sharp-cutoff filtering. The resulting signals are then demodulated by a quadrature demodulator. For other types of signals, other typical demodulation procedures and devices may be used after the fine-shifting operation.

Figure 18:
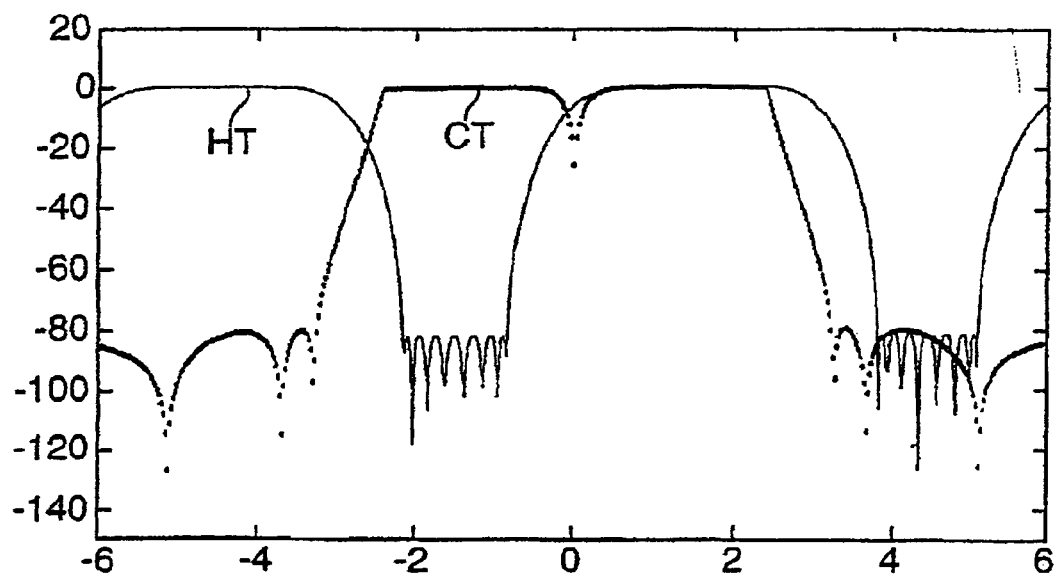
FIGS. 18 and 19 are simulated frequency response curves of certain elements of an embodiment of the present invention.
Figure 19:
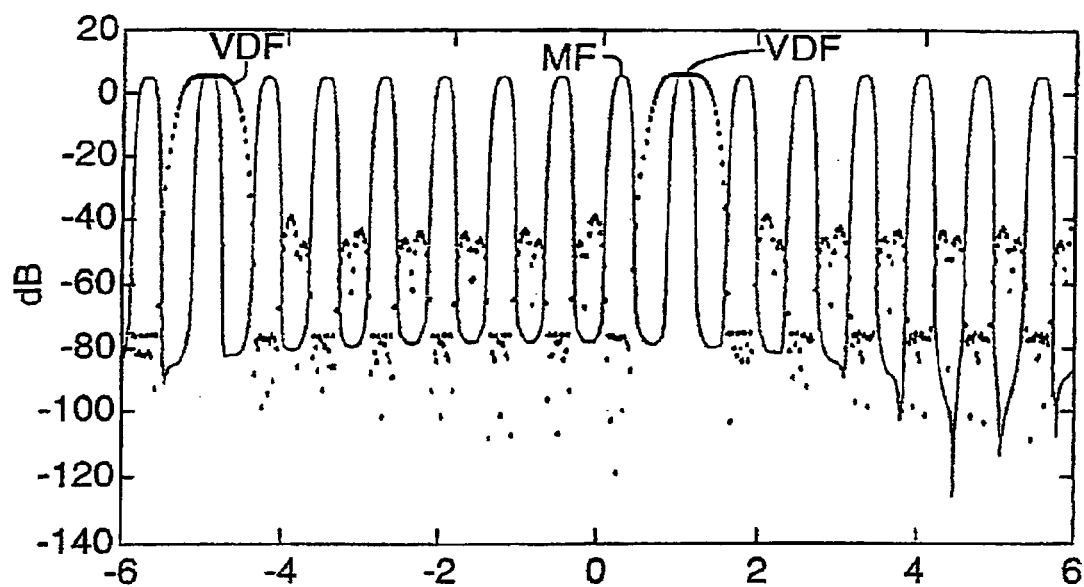
Figure 20:
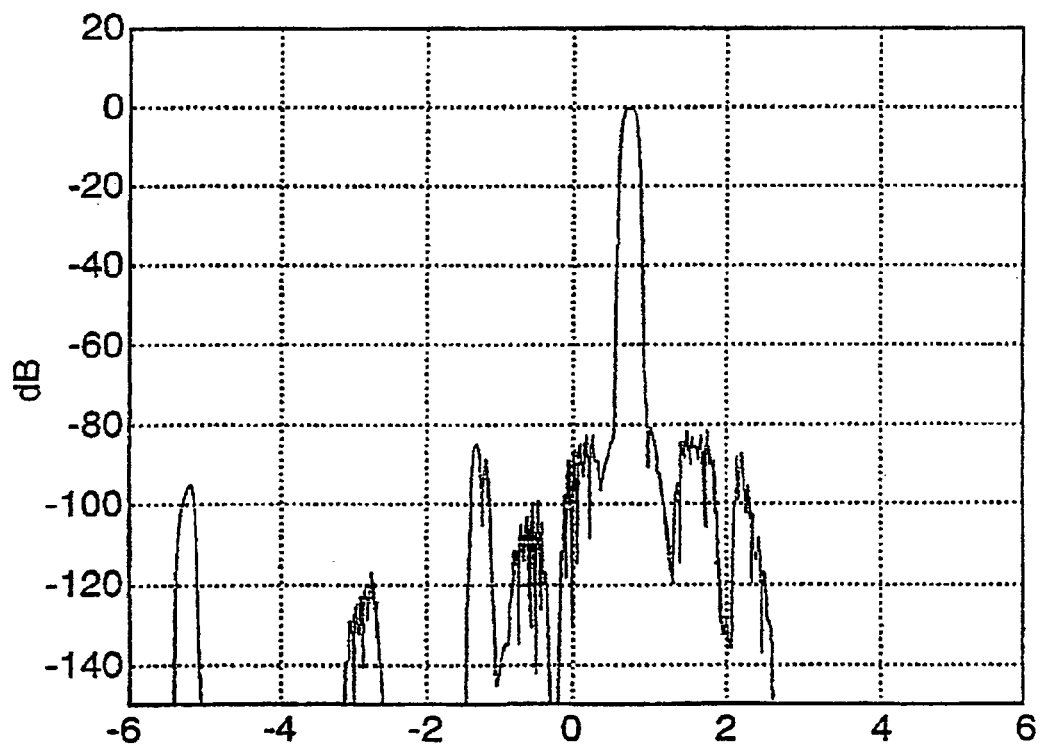
FIG. 20 is a simulated frequency response curve of an embodiment of the present invention.

Simulated frequency response curves for the embodiment of the device 10 of FIG. 8 not employing oversampling are seen in FIGS. 18-20.

FIG. 18 shows the continuous-time filtering frequency response curve CT together with the Hilbert transform frequency response curve HT. The CT curve shows the desired attenuation of frequencies near DC, together with anti-aliasing low pass filtering with a transition band from about 2.25 to about 3. Beginning the transition band above 2, the upper boundary of the near-baseband passband in this embodiment, avoids including the corner of the lowpass filter within the near-baseband passband, thereby avoiding significant group delay variations which can increase intersymbol interference. The beginning of the stopband at 3 could actually be relaxed, allowing the stopband to begin as late as 4 (minus $F_A$) without resulting in aliasing into the near-baseband passband at 1 to 2, given a sampling frequency of R=6 as preferred with a 1 to 2 near-baseband passband. The HT curve shows rejection of the mixing image at −1 to −2 on the x axis.

FIG. 19 shows a variable passband decimating filter frequency response curve VDF and a matched filter frequency response curve MF. The VDF curve shows a passband centered at 1 with seven stopbands to either side at intervals of 0.75=R/8=$R_D$. The matched filter frequency response curve MF is shown aligned with the VDF curve to reject signals within the transition band of the VDF curve. Translation to baseband is not shown.

FIG. 20 shows the system frequency response resulting from the cascade of the frequency responses shown in FIGS. 18 and 19.

Figure 21:
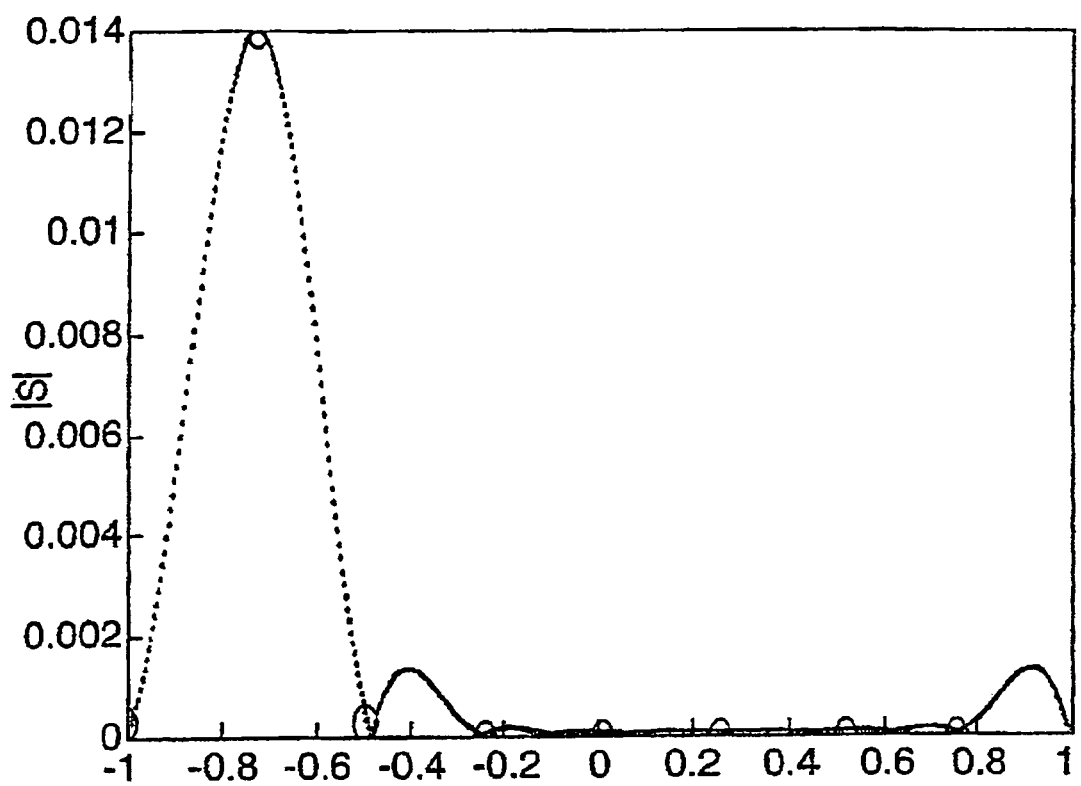
FIG. 21 is a simulated envelope detector output of an embodiment of the present invention.

FIG. 21 shows an envelope detector output resulting from simulated envelope detection of the simulated output of the device 10 of FIG. 8. Inter-symbol interference is −28.55 dB, well below the maximum allowable in most digital modulation schemes.

FIGS. 22-25 show simulated frequency response curves for the embodiment of the device 10 of FIG. 8 employing oversampling, but with M=16 (16 times oversampling) for illustration purposes rather than M=32 as currently most preferred.

Figure 22:
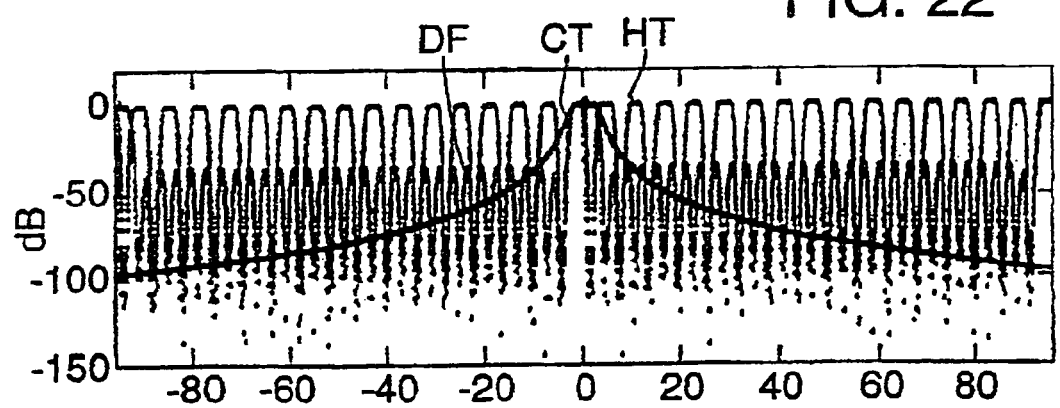
FIGS. 22 and 23 are simulated frequency response curves of certain elements of an embodiment of the present invention.

FIG. 22 shows the continuous-time filtering response curve CT, with the very relaxed upper transition bands employable with oversampling. The frequency curve HT response of the Hilbert transform and the frequency response curve DF of the decimating filters 34, 36 are also shown. The DF curve shows the desired passband at about 1 to 2 on the x axis with stopbands of the same width repeating at intervals of 3 on either side.

Figure 23:
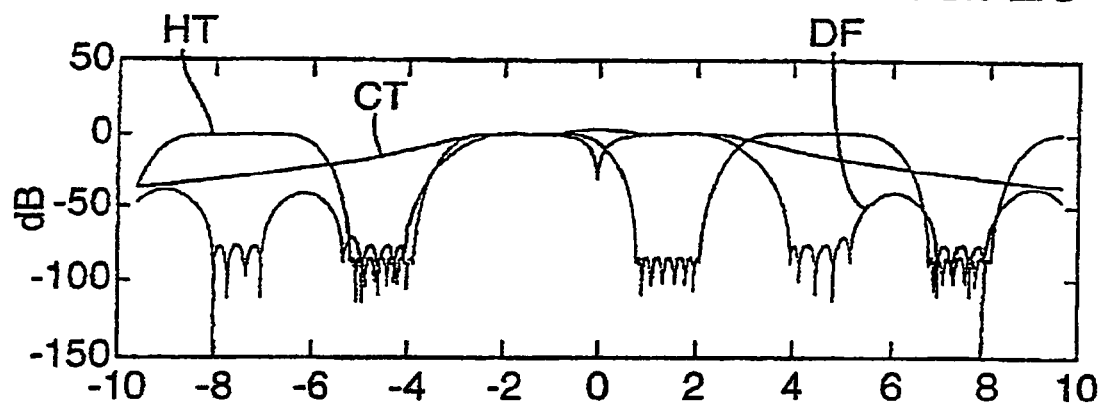

FIG. 23 shows the curves of FIG. 22 on a smaller scale. The unconstrained transition bands of the DF curve may be seen, as well as the image rejection of the HT curve at 1 to 2.

Figure 24:
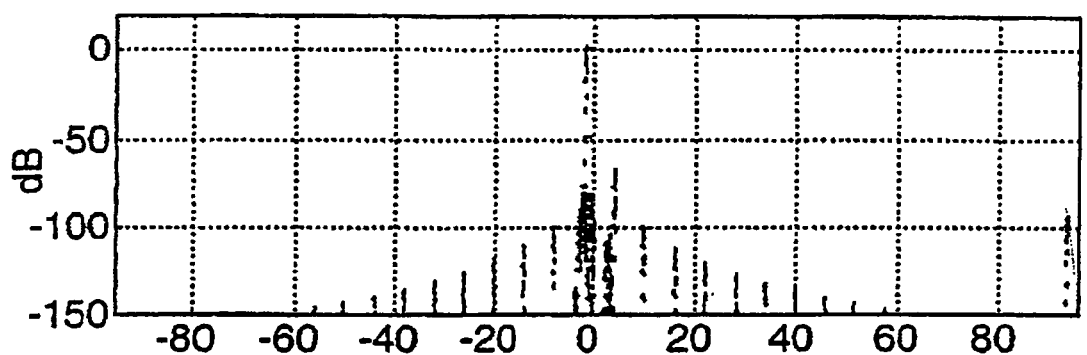
FIGS. 24 and 25 are simulated frequency response curves of an embodiment of the present invention.
Figure 25:
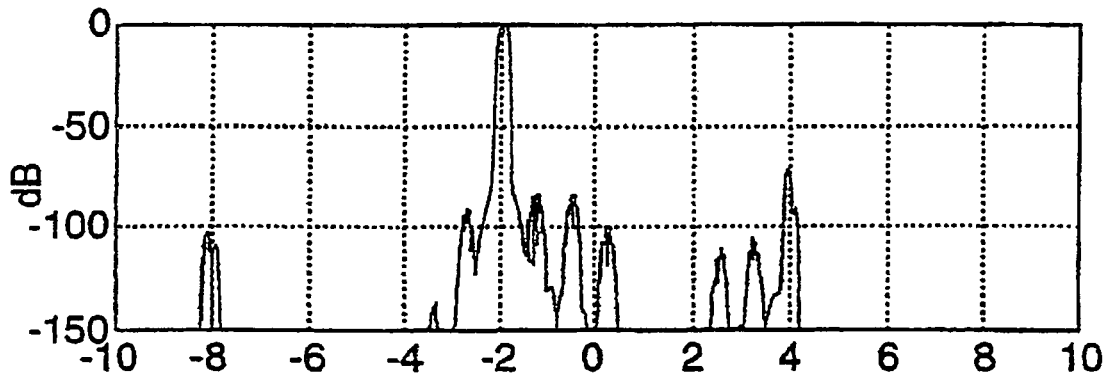

FIGS. 24 and 25 show a simulated system frequency response resulting from the embodiment of device 10 in Figure using oversampling at M=16. Attenuation of unwanted signals and noise meets the requirements of most commercially available mobile radio equipment (about 75 dB).

While the above described preferred embodiments are only the presently most preferred embodiments, certain additional general advantages of the present invention may be seen therein.

The particular division of functions between analog and digital portions of the device 10 allows sufficiently relaxed requirements for both the analog and digital portions that each can be implemented individually on a single integrated circuit. The processing power and memory requirements of the embodiment not employing oversampling are low enough to allow implementation of the entire digital portion in a current general purpose DSP. Even the oversampling embodiment may potentially be implemented in next-generation general purpose DSPs, or in an ASIC with no more complexity or power requirements than a general purpose DSP, or in a current DSP with a discrete component or two for performing the delta-sigma modulation. Single chip implementation of the entire device is even possible with adequate shielding of the analog portions from digital portion noise.

While not required, all of the filters in the digital domain may be implemented as single stage filters due in part to the location of the near-baseband passband of the present invention, and to the use of non-constrained transition bands. Single stage filtering is advantageous in the variable bandpass decimating filter 66, since only a single stage of coefficients must be varied to alter the passband location. The passband could thus be varied in real time to follow variations in a particular signal of interest. Single stage filtering is also very advantageous in the oversampling decimating filters 34, 36 because it allows elimination of multipliers and implementation with adders only.

The preferred use of a modified type III Hilbert transform allows particularly easy and efficient correction of phase errors between the quadrature I and Q signals. The use of a one bit wide signal path in the oversampling embodiment also allows easy correction of group delay differences between the I and Q signals.

As known to those of skill in the art, modulation and transmission of RF signals may be performed essentially by reversing the demodulation process. The device of the present invention may accordingly be adapted by those of skill in the art for use as a transmitter/receiver, if desired. In this case, the signal flow shown in FIG. 8 would be reversed. I and Q signals from a baseband modulator would be sent through transmit stages analogous to the receive stages shown. For example, a splitter would be substituted for the adder, interpolating filters substituted for the decimating filters, and digital to analog converters substituted for the analog to digital converters. The Hilbert transform pair and local oscillator(s) would function for transmission in the same manner as they function for reception. This substitution of analogous transmit stages for receive stages should be readily apparent to those of skill in the art.

Having illustrated and described the principles of the invention in a preferred embodiment, it should be apparent to those skilled in the art that the embodiment can be modified in arrangement and detail without departing from such principles. In view of the many possible embodiments to which the principles of the invention may be applied, it should be recognized that the illustrated embodiment is only a preferred example of the invention and should not be taken as a limitation on the scope of the invention. Rather, the invention is defined by the following claims. I therefore claim as my invention all such embodiments that come within the scope and spirit of the following claims.

The disclosure of originally filed claims 1-42 of parent application Ser. No. 10/032,526, being part of the specification thereof, is incorporated herein by reference.

TABLE I

| |
|---|
| % Define the delta-sigma oversampling frequency |
| % from the oversampling ratio |
| % and the discrete-time system sampling frequency |
| % (input to the Hilbert transform pair) |
| fds = fs * Mds; |
| % Define weight of passband as 1/R and weight of all |
| % stopbands as 1 |
| wt = [1/R ones(1,floor(Mds)−1]; |
| % Define passband of filter |
| f = [fs/6 fs/3 ]; |
| m = [1 1 ]; |
| % Define stopbands of filter only at frequency regions |
| % which would alias into passband |
| for k = 1:ceil(Mds)−1, |

TABLE I-continued

```
%       Stopbands fs/2 apart because real filter
        f(2*k+1:2*k+2) = [ -fs/12 fs/12] + ...
        (fs/2*k+fs/4)*ones(1,2);
        m(2*k+1:2*k+2) = [ 0 0 ];
     end
%    Adjust for 1 = Nyquist freq.
     f = f ./ (0.5*fds);
%    Compute filter using Remez exchange algorithm
     bds = remez(Nds,f,m,wt);
```

TABLE II

LOOK-UP TABLE COEFFICIENTS

| 54a | 54b | 54c | 54d |
|---|---|---|---|
| 164 | 4454 | −6504 | 7308 |
| 222 | 4538 | −7064 | 9174 |
| 276 | 4602 | −7626 | 11106 |
| 348 | 4646 | −8146 | 13098 |
| 426 | 4668 | −8638 | 15138 |
| 514 | 4664 | −9092 | 17224 |
| 608 | 4636 | −9508 | 19342 |
| 710 | 4582 | −9876 | 21486 |
| 820 | 4498 | −10194 | 23648 |
| 936 | 4384 | −10456 | 25816 |
| 1060 | 4238 | −10656 | 27980 |
| 1190 | 4060 | −10790 | 30134 |
| 1328 | 3850 | −10852 | 32264 |
| 1472 | 3604 | −10838 | 34362 |
| 1622 | 3324 | −10742 | 36418 |
| 1778 | 3008 | −10562 | 38420 |
| 1940 | 2658 | −10292 | 40360 |
| 2106 | 2272 | −9930 | 42228 |
| 2276 | 1852 | −9474 | 44016 |
| 2450 | 1398 | −8920 | 45712 |
| 2624 | 912 | −8266 | 47310 |
| 2802 | 394 | −7510 | 48798 |
| 2978 | −156 | −6652 | 50172 |
| 3154 | −732 | −5692 | 51424 |
| 3328 | −1334 | −4630 | 52546 |
| 3498 | −1960 | −3468 | 53532 |
| 3664 | −2604 | −2204 | 54378 |
| 3822 | −3266 | −844 | 55076 |
| 3972 | −3940 | 612 | 55630 |
| 4112 | −4624 | 2160 | 56028 |
| 4240 | −5304 | 3794 | 56288 |
| 4354 | −5996 | 5512 | 56372 |

TABLE III

```
%    Define the zero degree delay as a unit sample in
%    the center of an FIR filter of equal length to the
%    90 degree Hilbert transform filter. Only the
%    samples before the unit sample need to be
%    implemented in practice.
     bhI = [zeros(1,(Nh−1)/2) 1 zeros(1, (Nh−1)/2)];
%    Define passband of the Hilbert transform
     fhilb = [(fref/2 − fbw/2) (fref + fbw/2)] / (fs/2);
%    Define the 90 degree Hilbert transform using Remez
%    exchange algorithm
     bhQ = remez(Nh,fhilb,[1 1], 'Hilbert');
%    Scale amplitude of Q channel coefficients for gain
%    imbalance compensation
     bhQv = QG .* bhQ .* SB;
%    Adjust amplitude of center Q channel coefficient to
%    vary phase from 90 degrees. This provides phase
%    imbalance compensation.
     bhQv((Nh/2)+1) = tan((2*pi)/360 * QP);
```

TABLE IV

```
function b = dbf(N,R,f1,f2,fbw)
%    b = dbf(N,R,f1,f2,fbw)
%    Decimating Bandpass Filter
%    Nth-order bandpass FIR with decimation and
%    asymmetrical frequency response
%    R parameter (50 suggested) determines relative
%    importance of passband and stopbands
%    f1 is input sampling rate
%    f2 is output sampling rate
%    fbw is 2-sided bandwidth of interest
%    Calculate cutoff frequency of prototype LPF (1/2 BW
%    of interest)
     fc = fbw/2;
%    Iterate to get all stopband regions except at f=1
     M = f1/f2;
%    Parks McClellan: define bands
%    ----------------------------------------------------
%    Define passband of filter
     f = [ 0 fc ] ;
     m = [ 1 1 ] ;
%    Define weight of stopband vs. passband based on R
     parameter
%    50 gives Rp<0.01dB with Rs<-100dB
%    Define weight of passband as 1/R and weight of all
%    stopbands as 1
     wt = [ 1/R ones(1,floor(M/2))];
%    Define stopbands of filter only at frequency regions
%    which would alias into passband
     for k = 1:ceil(M/2)−1,
        f(2*k+1:2*k+2) = [ −fc fc ] + f2*k*ones(1,2);
        m(2*k+1:2*k+2) = [ 0 0 ];
     end
%    If M is even, append a fixed stopband at Nyquist
%    frequency
if ceil(M/2)==M/2
        f(M+1:M+2) = [ f1/2−fc f1/2 ];
        m(M+1:M+2) = [ 0 0 ];
     end
%    Adjust for 1 = Nyquist freq.
     f = f ./ (0.5*f1);
%    Compute filter using Remez exchange algorithm
     if N>=3
        b = remez(N,f,m,wt);
     else
        %Order less than 3 is defined to be just a
        %zero-order
        %allpass
        b = 1
     end
%    Define transfer function denominator coefficients as
%    simply a one followed by zeroes
     a = [1 zeros(1,max(Size(b))−1))];
%    Make sure H(0)=1
     k = freqz(b,a,linspace(0,pi));
     b = b ./ max(abs(k));
%end of function
end
```

TABLE V

```
n = 1:length(b);
b = b . * exp(i*2*pi*(fshift/fs)*n));
```

What is claimed is:

1. A method of selectively tuning any wanted channel from a received signal, the received signal having a channelized spectrum with a uniform channel spacing, comprising:

(a) setting a local oscillator to a first local oscillator frequency;

(b) generating a first set of I and Q signals at the first local oscillator frequency displaced more than one channel spacing from the wanted signal center frequency;

(c) mixing the first set of I and Q signals with the received signal;

(d) selecting an upper high frequency spectrum of interest above the first local oscillator frequency;
(e) setting the local oscillator to a second local oscillator frequency that is spaced from the first local oscillator frequency by an amount greater than or equal to the channel spacing;
(f) generating a second set of I and Q signals at the second local oscillator frequency;
(g) mixing the second set of I and Q signals with the received signal;
(h) selecting a lower high frequency spectrum of interest below the second local oscillator frequency;
(i) translating the selected frequency spectrum of interest to be demodulated to within a passband that is near baseband; and
(j) spacing the lower edge of the passband that is near baseband from DC by at least about an amount greater than or equal to 20 kHz.

2. The method of claim 1 wherein the lower edge of the passband that is near baseband is spaced from DC by about twice the passband bandwidth.

3. The method of claim 1 wherein the local oscillator frequencies are selected using discrete digital tuning, and the center frequency of each wanted channel from the channelized spectrum is translated to within a frequency range extending from about one to about two channel spacings above DC by mixing the received signal with one of the various local oscillator frequencies.

4. A method of selectively tuning any wanted channel from a received signal, the received signal having a channelized spectrum with a uniform channel spacing, comprising:
(a) setting a local oscillator to a first local oscillator frequency displaced more than one channel spacing from the wanted signal center frequency;
(b) generating a first set of I and Q signals at the first local oscillator frequency;
(c) mixing the first set of I and Q signals with the received signal;
(d) selecting a lower high frequency spectrum of interest below the first local oscillator frequency;
(e) setting the local oscillator to a second local oscillator frequency that is spaced from the first local oscillator frequency by an amount greater than or equal to the channel spacing;
(f) generating a second set of I and Q signals at the second local oscillator frequency;
(g) mixing the second set of I and Q signals with the received signal;
(h) selecting a upper high frequency spectrum of interest above the second local oscillator frequency;
(i) translating the selected frequency spectrum of interest to be demodulated to within a passband that is near baseband; and,
(j) spacing the lower edge of the passband that is near baseband from DC by at least about an amount greater than 20 kHz.

5. The method of claim 4 wherein the lower edge of the passband that is near baseband is spaced from DC by about twice the passband bandwidth.

6. The method of claim 4 wherein the local oscillator frequencies are selected using discrete digital tuning, and the center frequency of each wanted channel from the channelized spectrum is translated to within a frequency range extending from about one to about two channel spacings above DC by mixing the received signal with one of the various local oscillator frequencies.

7. A method of selectively tuning any wanted signal from a received signal, the received signal having a channelized spectrum with a uniform channel spacing, comprising:
(a) setting a local oscillator to a first local oscillator frequency displaced more than one channel spacing from the wanted signal center frequency;
(b) generating a first set of I and Q signals at the first local oscillator frequency;
(c) mixing the first set of I and Q signals with the received signal;
(d) selecting an upper high frequency spectrum of interest above the first local oscillator frequency;
(e) setting the local oscillator to a second local oscillator frequency that is spaced from the first local oscillator frequency by an amount greater than or equal to the channel spacing;
(f) generating a second set of I and Q signals at the second local oscillator frequency;
(g) mixing the second set of I and Q signals with the received signal;
(h) selecting a lower high frequency spectrum of interest below the second local oscillator frequency;
(i) translating the selected upper frequency spectrum of interest to be demodulated to within a passband that is near baseband using the first set of I and Q signals;
(j) combining the outputs of I and Q mixers to reject interfering image signals appearing in the passband that is near baseband; and
(k) spacing the lower edge of the passband that is near baseband from DC by at least about the bandwidth of the wanted signal.

8. The method of claim 7 wherein the lower edge of the passband that is near baseband is spaced from DC by about twice the passband bandwidth.

9. The method of claim 7 wherein the local oscillator frequencies are selected using discrete digital tuning, and the center frequency of each wanted signal from the channelized spectrum is translated to within a frequency range extending from about one to about two channel spacings above DC by mixing the received signal with one of the various local oscillator frequencies.

10. A method of selectively tuning any wanted signal from a received signal, the received signal having a channelized spectrum with a uniform channel spacing, comprising:
(a) setting a local oscillator to a first local oscillator frequency displaced more than one channel spacing from the wanted signal center frequency;
(b) generating a first set of I and Q signals at the first local oscillator frequency;
(c) mixing the first set of I and Q signals with the received signal;
(d) selecting a lower high frequency spectrum of interest below the first local oscillator frequency;
(e) setting the local oscillator to a second local oscillator frequency that is spaced from the first local oscillator frequency by an amount greater than or equal to the channel spacing;
(f) generating a second set of I and Q signals at the second local oscillator frequency;
(g) mixing the second set of I and Q signals with the received signal;
(h) selecting a upper high frequency spectrum of interest above the second local oscillator frequency;
(i) translating the selected high frequency spectrum of interest to be demodulated to within a passband that is near baseband; and (j) spacing the lower edge of the passband that is near baseband from DC by at least about the bandwidth of the wanted signal.

11. The method of claim 10 wherein the lower edge of the passband that is near baseband is spaced from DC by about twice the passband bandwidth.

12. The method of claim 10 wherein the local oscillator frequencies are selected using discrete digital tuning, and the center frequency of each wanted signal from the channelized spectrum is translated to within a frequency range extending from about one to about two channel spacing above DC by mixing the received signal with one of the various local oscillator frequencies.

13. A method of selecting and switching between an upper high frequency spectrum of interest and a lower high frequency spectrum of interest associated with a down-converted signal of interest being any one selected channel from among a plurality of channels from a channelized spectrum having a uniform channel spacing, comprising:
  (a) adjusting a local oscillator to a first local oscillator frequency displaced more than one channel spacing from the wanted signal center frequency;
  (b) mixing the first local oscillator frequency with the channelized spectrum;
  (c) down-converting a radio frequency signal to a passband that is near baseband;
  (d) spacing the lower edge of the passband that is near baseband from DC by at least an amount greater than 20 kHz;
  (e) selecting and demodulating either an upper or lower high frequency spectrum of interest associated with the down-converted radio frequency signal and the first local oscillator frequency;
  (f) adjusting the local oscillator to a second local oscillator frequency that is spaced from the first local oscillator frequency by an amount greater than or equal to the channel spacing;
  (g) mixing the second local oscillator frequency with the channelized spectrum;
  (h) down-converting the radio frequency signal to the passband that is near baseband;
  (i) spacing the lower edge of the passband that is near baseband from DC by at least an amount greater than 20 kHz;
  (j) switching from the selected upper or lower high frequency spectrum of interest generated using the first local oscillator frequency to a selected lower or upper high frequency spectrum of interest, respectively, generated using the second local oscillator frequency.

14. A method of tuning channels of interest from a channelized spectrum comprising:
  (a) mixing a channel of interest from a channelized spectrum having a predetermined channel spacing with a first local oscillator signal, having a first frequency that is:
    (1) one half of a channel spacing displaced from the center frequency of the channel of interest; and
    (2) selected to frequency translate the channel of interest to within a passband that is near baseband and that extends near to but excludes DC;
  (b) mixing the channel of interest with a second local oscillator signal having the first frequency and being approximately in quadrature with the first local oscillator signal; and
  (c) selecting between:
    (1) providing spectrum coverage within a lower high frequency spectrum of interest and not an upper high frequency spectrum of interest; and
    (2) providing spectrum coverage within an upper high frequency spectrum of interest and not a lower high frequency spectrum of interest;
  (d) wherein the channel of interest:
    (1) has a predetermined maximum bandwidth less than the channel spacing; and
    (2) lies within one of an upper high frequency spectrum of interest and a lower high frequency spectrum of interest.

15. The method of claim 14 farther comprising coarse-tuning the local oscillator signal by a local oscillator step from the first local oscillator signal frequency to a second local oscillator signal frequency an integral number of channel spacings from the first frequency.

16. The method of claim 14 wherein the outputs of the first and second mixing operations are further processed to reject either the upper or lower high frequency spectrum of interest.

17. The method of claim 14 wherein the lower edge of the passband that is near baseband is al least about 20 Khz spaced from DC.

18. The method of claim 14 wherein the upper high frequency spectrum of interest may be selected for some channels of interest and the lower high frequency spectrum of interest may be selected for other channels of interest.

19. A method of tuning any one selected channel from among a plurality of selected channels of interest from a plurality of channels comprising:
  (a) at a first time, mixing a first selected channel of interest with a first local oscillator signal that has a frequency displaced above the first selected channel of interest by more than a channel spacing;
  (b) at a second time, mixing a second selected channel of interest with a second local oscillator signal that has a frequency displaced below the second selected channel of interest by more than a channel spacing;
  (c) frequency translating to a passband that is near baseband either the first selected channel of interest or the second selected channel of interest; and
  (d) reducing an image frequency of either the first selected channel of interest or the second selected channel of interest.

20. The method of claim 19 wherein the first selected channel of interest and the second selected channel of interest are the same channel.

* * * * *